United States Patent [19]
Bertolasi et al.

[11] Patent Number: 4,734,861
[45] Date of Patent: Mar. 29, 1988

[54] ELECTRONIC CONTROL FOR MOTOR VEHICLE TRANSMISSION

[75] Inventors: Robert B. Bertolasi; Richard A. Zwicky; Paul C. Blank, all of Rockford, Ill.

[73] Assignee: Twin Disc, Incorporated, Racine, Wis.

[21] Appl. No.: 883,864

[22] Filed: Jul. 11, 1986

Related U.S. Application Data

[63] Continuation of Ser. No. 644,699, Aug. 27, 1984, abandoned.

[51] Int. Cl.$^4$ .............................................. B60K 41/00
[52] U.S. Cl. ............................... 364/424.1; 192/0.076; 364/569
[58] Field of Search ............................ 364/424.1, 569; 192/0.052, 0.075, 0.076; 74/866

[56] References Cited

U.S. PATENT DOCUMENTS

| | | | |
|---|---|---|---|
| 3,805,640 | 4/1974 | Schneider et al. | 74/866 |
| 3,885,472 | 5/1975 | Wakamatsu et al. | 74/866 |
| 4,176,337 | 11/1979 | Aechter et al. | 364/569 |
| 4,303,983 | 12/1981 | Chaborski | 364/569 |
| 4,338,832 | 7/1982 | Pelligrino | 74/866 |
| 4,350,057 | 9/1982 | Kishi et al. | 74/866 |
| 4,487,303 | 12/1984 | Boueri et al. | 192/0.076 |
| 4,509,124 | 4/1985 | Suzuki et al. | 74/866 |
| 4,527,678 | 7/1985 | Pierce et al. | 74/866 |
| 4,529,072 | 7/1985 | Oguma et al. | 192/0.076 |

FOREIGN PATENT DOCUMENTS

1462957  1/1977  United Kingdom ............ 364/424.1

Primary Examiner—Parshotam S. Lall
Attorney, Agent, or Firm—James E. Nilles; Thomas F. Kirby

[57] ABSTRACT

An electronic control for the automatic transmission of a motor vehicle receives input signal in digital, analog, and pulsed form from signal generating devices responsive to operating conditions in the apparatus, processes them in accordance with a stored program and provides output signals to operate various tranducers. The electronic control is embodied in a stack of customized circuit boards. Each board is connected to a control bus (for information exchange between boards) and to an I/O signal bus (for information exchange between the apparatus and the electronic control). A connector board is connected to an electric power supply, to the signal generating devices, to the transducers and to visual display devices. A CPU (central processing unit) board protects against data loss in low/off power conditions. An input signal board employs high-speed logic circuits for measuring time length between leading edges of pulsed input signals to ascertain magnitude and rate of change of the rotational speed of certain components and actuates clutch solenoids accordingly. An output signal board embodies improved transducer-drive circuits for the clutch solenoids.

7 Claims, 15 Drawing Figures

ELECTRONIC CONTROL FOR MOTOR VEHICLE TRANSMISSION

This application is a continuation of application Ser. No. 644,699, filed 8/27/84, now abandoned.

BACKGROUND OF THE INVENTION

1. Field of Use

This invention relates generally to an electronic control for receiving input signals from signal generating devices in apparatus to be controlled, such as a motor vehicle transmission or the like, and for providing appropriate output signals to operate transducers in said apparatus.

2. Description of the Prior Art

U.S. Pat. Nos. 4,015,488 and 4,338,832, both assigned to the same assignee as the present application, disclose electronic controllers (digital and analog, respectively) responsive to various input signals, such as shift range selected, vehicle speed and so forth, for operating clutch solenoid valves in a hydraulically operated automatic motor vehicle transmission to effect automatic and timely shifting to various speed ranges. These prior art controllers embodied electronic components and circuitry available at the time.

SUMMARY OF THE PRESENT INVENTION

An electronic control in accordance with the present invention is especially well-suited to operate apparatus, such as an automatic motor vehicle transmission, but has many other applications. The electronic control receives relevant input signals from signal generating devices, such as shift range selectors, speed sensors or the like, in the apparatus to be controlled and provides appropriate output signals to transducers, such as solenoids, electric motors or the like, to operate the apparatus in a certain manner, such as by means of actuation of solenoid-operated hydraulic control valves for motor vehicle transmission clutches, for example.

The electronic control comprises: a plurality of customized circuit boards embodied in a stack; a plurality of electrical components mounted on the front side of each board; a plurality of electrically conductive edge contacts on either or both sides of each board near at least one of the side edges thereof, and each contact is electrically connected to components on its respective board; means for mechanically securing the circuit boards in spaced apart relationship in a stack and for enabling individual boards to be removed from and inserted into the stack; a plurality of edge connectors, each removably mounted on an edge of a board and electrically connected to the edge contacts thereat; and electrical conductors connected between each pair of adjacent edge connectors. Preferably, the front sides of all boards face in the same direction, except for a board at one end of said stack whose front side faces in an opposite direction so that components, such as a solid state central processing unit of desired type or other components, can be attached or removed therefrom without removal from the stack. The components on a connector board at the other end of the stack include at least one electrical connector connectable to a cable extending from the signal generating devices and transducers of apparatus to be controlled. Preferably, at least two of the boards have electrically conductive edge contacts near both side edges thereof whereby each of the two boards is able to accommodate two edge connectors.

The customized circuit boards include, for example, a CPU (central processing unit) board, a duty cycle (or miscellaneous) board, a signal input board, a signal output board, and a connector board which is connectable to the signal generating devices, to the transducers and to visual display devices mounted on the control or on the apparatus or elsewhere. Each board is electrically connected at one edge to a control bus (comprised of edge contacts, edge connectors and their electrical conductors) to enable internal signal information exchange between the various boards. Each board is also electrically connected at its other edge to an I/O signal bus (comprised of edge contacts, edge connectors, and their electrical conductors) to enable input and output signal information exchange between the apparatus being controlled and the electronic control itself.

Each customized circuit board contains basic components and circuits needed to carry out its particular function and can be designed to accommodate additional components to enhance its capability. Furthermore, the circuit boards can be stacked in whatever order best suits the application of the control. Such versatility enables simple and economical production of an electronic control suited for use with a particular type of apparatus, such as automatic transmissions for motor vehicles as diverse as airport crash trucks, agricultural tractors, on-road trucks, off-road construction machinery, railroad cars and so forth. Customized electronic controls can also be provided for any type of apparatus, stationary or movable, where input and output signals are required for operation.

The above-identified customized circuit boards generally comprise components and circuits which perform as follows, for example.

The connector board comprises a connector strip (or connectors) connected to receive input signals from the signal generating devices or sensors, to provide output signals to the tranducer, and to receive electrical operating power from the battery/generator on the apparatus. The connector board also comprises means to condition and regulate electric power it supplies to other boards in the control. The connector board also comprises data latch means and other components to drive one or more visual display devices which provide readouts of apparatus and/or control performance and which are located on the connector board, on the apparatus, or wherever convenient.

The input signal board has one or more channels for receiving and processing each of the three following types of input signals received from signal generating devices or sensors on the apparatus, namely: an on/off switch signal indicative of the presence or absence of some condition (i.e., valve open or closed, or physical position of some component on the apparatus); an analog signal converted to a digital signal and indicative of some variable condition such as one of several component positions; and a series of pulse or frequency signals indicative of the magnitude of some value (such as speed) and any rate of change in the magntude. The input signal board includes an improved high-speed logic circuit for measuring the time interval between the leading edges of successive pulse signals in the series (instead of counting the number of pulses per unit of time) to thereby more quickly obtain more accurate data.

The CPU board embodies multiple memory banks and isolation circuits to protect against data loss from the memory circuits in low power conditions.

The output signal board embodies address decoding circuits, logic circuits for enabling operation of the solenoid driver circuits, and buffer circuits. It further includes circuits to effect digitally commanded pulse-width modulation complimented by analog processes to manage the power requirements of the transducer (solenoid) drives. It features a self-resetting current protection transducer drive circuit which shuts off the output stage instead of merely limiting output current (and holding in high dissipation condition). The output power circuit is isolated from the logic drive circuit by optical devices for better resistance to inductive pick-up and switching transients. Error checking is provided by "exclusive or" checks of driver output to power output. Auxilary voltage outputs regulated and open collector (sink) outputs are available.

The duty cycle board embodies circuits for adaptive modulation of the output current to the transducers and can be constructed or wired to suit the particular needs of a system being controlled as regards timing needs, power needs or the like. It employs a pulse width regulator and a controlled sequence digital-to-analog converter for managing up/down ramping or direct setting functions.

Generally speaking, the electronic control in accordance with the invention is capable of higher speed operation and has lower power requirements than prior art controllers and can be easily and economically custom-designed for an extremely wide variety of applications. Other objects and advantages of the invention will hereinafter appear.

DRAWINGS

DESCRIPTION OF PREFERRED EMBODIMENTS

Figure 1:
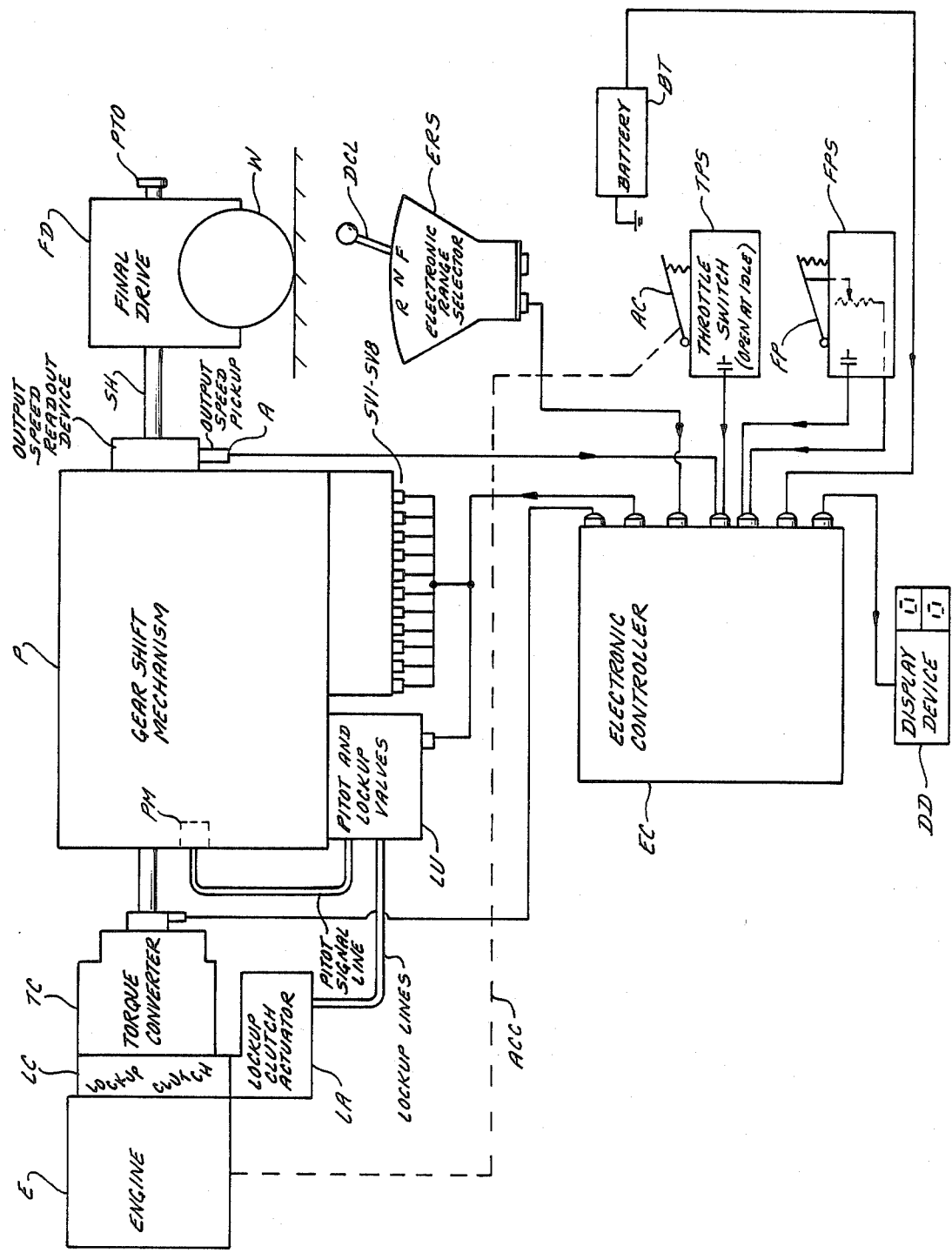
FIG. 1 is a schematic diagram of a system comprising an electronic control in accordance with the invention and apparatus, such as an automatic transmission of a motor vehicle, controlled thereby.

FIG. 1 shows an electronic control EC in accordance with the invention associated with apparatus, such as a vehicle transmission system, controlled thereby. The transmission system comprises a torque converter TC driven by an engine E for driving a speed changing gear shift mechanism P which transmits power to vehicle wheels W through an output shaft SH and a final drive FD. Engine E is accelerated or decelerated by an accelerator pedal AC. A lock-up clutch LC connects the torque converter TC for direct drive when the speed of engine E is sufficiently high. Shifting in or out of clutch lockup is controlled by a lock-up clutch valve LU which operates a lock-up clutch actuator LA in response to fluid pressure conditions in a pitot device PM connected to the gear shift mechanism P. The gear shift mechanism P includes sets of gears (not shown) for enabling operation in neutral, forward, or reverse, and through various shift ranges, and with clutches (not shown) which are selectively operable to shift into the specified shift ranges. Eight solenoid-operated clutch valves or transducers designated SV1 through SV8 operate the clutches.

Electronic control EC furnishes electrical output signals for actuation of the solenoids of the solenoid-operated clutch valves SV1 through SV8 and other transducers to thereby operate the transmission system. The control EC receives input signals from three sources, for example, namely: on-off range signals from switches operated by a manually operable multiposition shift range selector switch ERS; a series of pulsed speed signals (variable in frequency and pulse width) from an electromagnetic output speed sensor A on gear shift mechanism P; and an analog acceleration signal from an engine throttle rheostat-type position sensor TPS. Sensor TPS operates when the accelerator pedal AC is depressed for acceleration or released for deceleration. U.S. Pat. No. 3,805,640 discloses a shift mechanism, solenoid-operated clutch valve, a selector switch, and a speed pickup sensor generally similar to those specified herein.

Figure 2:
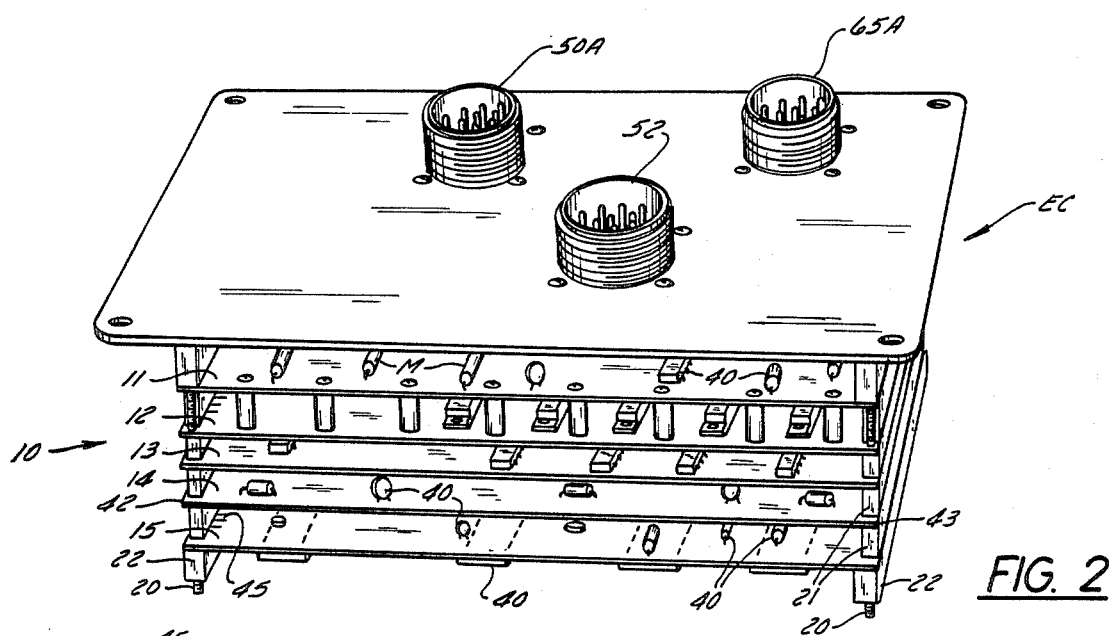
FIG. 2 is an enlarged perspective view of the electronic control of FIG. 1 and showing the stack of circuit boards in which it is embodied.
Figure 3A:
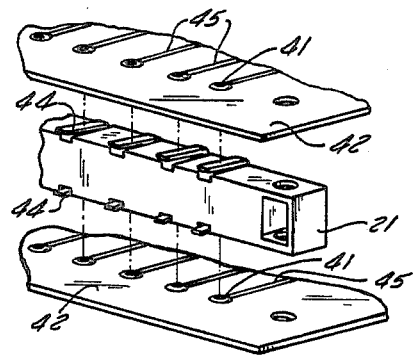
FIG. 3A is a perspective view of a typical edge connector used with the boards of FIGS. 2 and 3.
Figure 3:
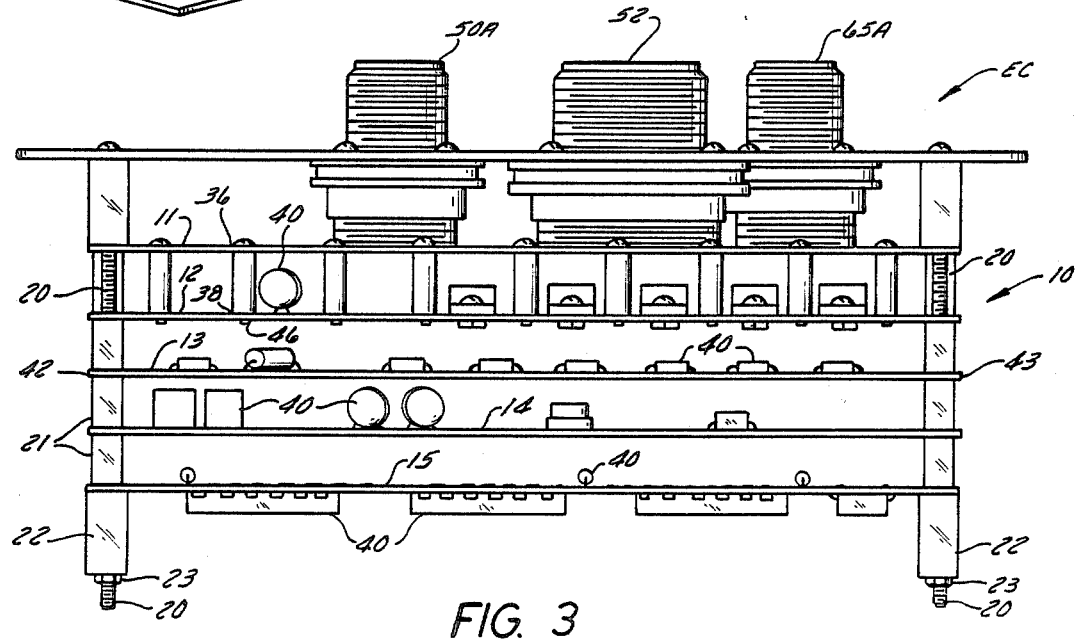
FIG. 3 is a side elevation view of the stack of FIG. 2 illustrating certain interior details.

FIGS. 2 and 3 show that the electronic control EC comprises a plurality of customized circuit boards 11 through 15 embodied in a stack 10; a plurality of electrical components 40 mounted on the front side of each board; and a plurality of electrically conductive edge contacts 41 on both sides of each board near the side edges 42 or 43 thereof, and each edge contact 41 is electrically connected to components 40 on its respective board. Means are provided for mechanically securing the circuit boards in spaced apart relationship in stack 10 and for enabling individual boards to be removed from and inserted into the stack. Thus, the boards are mounted on a set of seven threaded studs 20 (each with a nut 23) with several resilient connectors 21 on each stud between which contact the surfaces of boards and traps the boards therebetween under resilient mechanical pressure so that there is captivation of the boards and each can be removed and replaced by disassembly of the entire stack 10. When the boards are in stack 10, they are spaced one from another with a set of four connectors 21, between each pair of boards and the final board 15 has a pressure bar 22 and fastening hardware, such as the studs 20 and nuts 23 which put tension on the entire array of boards in stack 10. A plurality of edge connectors 44 are provided, each removably mounted on a side edge 42 or 43 of a board and electrically connected to the edge contacts 41 thereat. Electrical conductors 45 are connected between each pair of adjacent edge connectors 44. Preferably, the front sides of all boards face in the same direction, except for board 15 at one end of stack 10 whose front side faces in an opposite direction so that its components 40, such as a solid state central processing unit of desired type or other components such as testing devices, can be attached or removed therefrom without removal of the board from the stack 10. The components M on connector board 11 at the other end of stack 10 include at least one electrical connector connectable to a cable extending from the signal generating devices and transducers of the apparatus to be controlled.

The customized circuit boards include, for example, a CPU (central processing unit) board 15, a duty cycle (or miscellaneous) board 14, a signal input board 13, a signal output board 12, and a connector board 11 which is connectable to the signal generating devices, to the transducers and to visual display devices mounted on the control EC or on the apparatus or elsewhere. Each board 11 through 15 is electrically connected at one side edge 42 to a control bus 31 (comprised of edge contacts 41, edge connectors 44 and their electrical conductors 45) to enable internal signal information exchange between the various boards. Each board 11 through 15 is also electrically connected at its other side edge 43 to an I/O signal bus 33 (also comprised of edge contacts 41, edge connectors 44 and their electrical conductors 45) to enable input and output signal information exchange between the apparatus being controlled and the electronic control itself. On control or data bus 31 data lines, address lines, read and write strobe lines, pertinent voltages, black-out, brown-out and control signals are passed back and forth from the connector board 11 through the stack 10 to the CPU board 15 or from the CPU board 15 up through various boards in the stack. The I/O signal bus 33 carries inputs which could be switch inputs, frequency inputs, voltages in case of voltage sensing circuitry, circuit conditions and the outputs which may be, for example, a tach signal output circuit, lamp driving output circuit or various supplemental output circuits that are not related in a main transmission control.

Each customized circuit board contains basic components and circuits needed to carry out its particular function and can be designed to accommodate additional components for inputs, outputs and control to enhance its capability. Furthermore, the circuit boards can be stacked in whatever order best suits the application of the control. The architecture of stack 10 is such that its boards can be reached by the CPU board 15, can be given inputs, and the outputs therefrom can be taken from the boards to and from the connector board 11. Such versatility enables simple and economical production of an electronic control suited for use with a particular type of apparatus, such as automatic transmissions for motor vehicles as diverse as airport crash trucks, agricultural tractors, or the like.

FIGS. 2 and 3 show a set of connections which are not made by way of the buses 31 and 33; these are the actual solenoid driver connections 36 and the high power lamp or read-out display connections 38. The display driving connection may include direct controls for displays onboard the control EC or for "simple" remote devices, as well as multiplexed bit-oriented data transmitters capable of operating "hard wire" or fiber optic linkages to remote displays located remotely from the control EC. The connections 36 and 38 are made directly between the output board 12 and the connector board 11 by way of soldering (not shown) or threaded studs 46 and screw-lock washer-type hardware because of the high current levels which can be encountered and the long-standing problem with passing DC current through plated contacts from board-to-board.

The electronic control EC is shown herein as employed with a specific form of apparatus (automatic vehicle transmission) which it controls, and as comprising five circuit boards adapted for use with certain inputs and outputs. However, the form of stack 10 and the construction and layout of the boards shown in FIG. 4 and FIGS. 6 through 10 could differ depending on needs. For example, if only eight switches or eight switch positions are required, then an additional bay of eight input components, bufers, de-spiking circuitry, latches and inverters would not need to be included on the input board 13. Only hardware necessary for a specific vehicle or apparatus need be included in the stack. Similarly, additional outputs may be provided in the output board 12 which may eventually become necessary, and corresponding supplemental capability may be provided as in the duty cycle board 14. The duty cycle board 14 may be provided as with padded-up circuit connections and other general utility areas and could be provided with additional lamp drivers or lower current solenoid drivers, the outputs from such a board being delivered from the I/O bus 33. The number of circuit boards in stack 10 is not limited. Typically, there is one input board 13 and one miscellaneous or duty cycle board 14, but additional boards can be placed into stack 10. The CPU board 15 shown, for example, is provided with decoding capabilities that would allow it to reach eight entirely different input channel sets (each set up to 16 bays of 8 bits) and eight entirely different output channel sets. However, only a few of these channels are used in the present embodiment.

Figure 4:
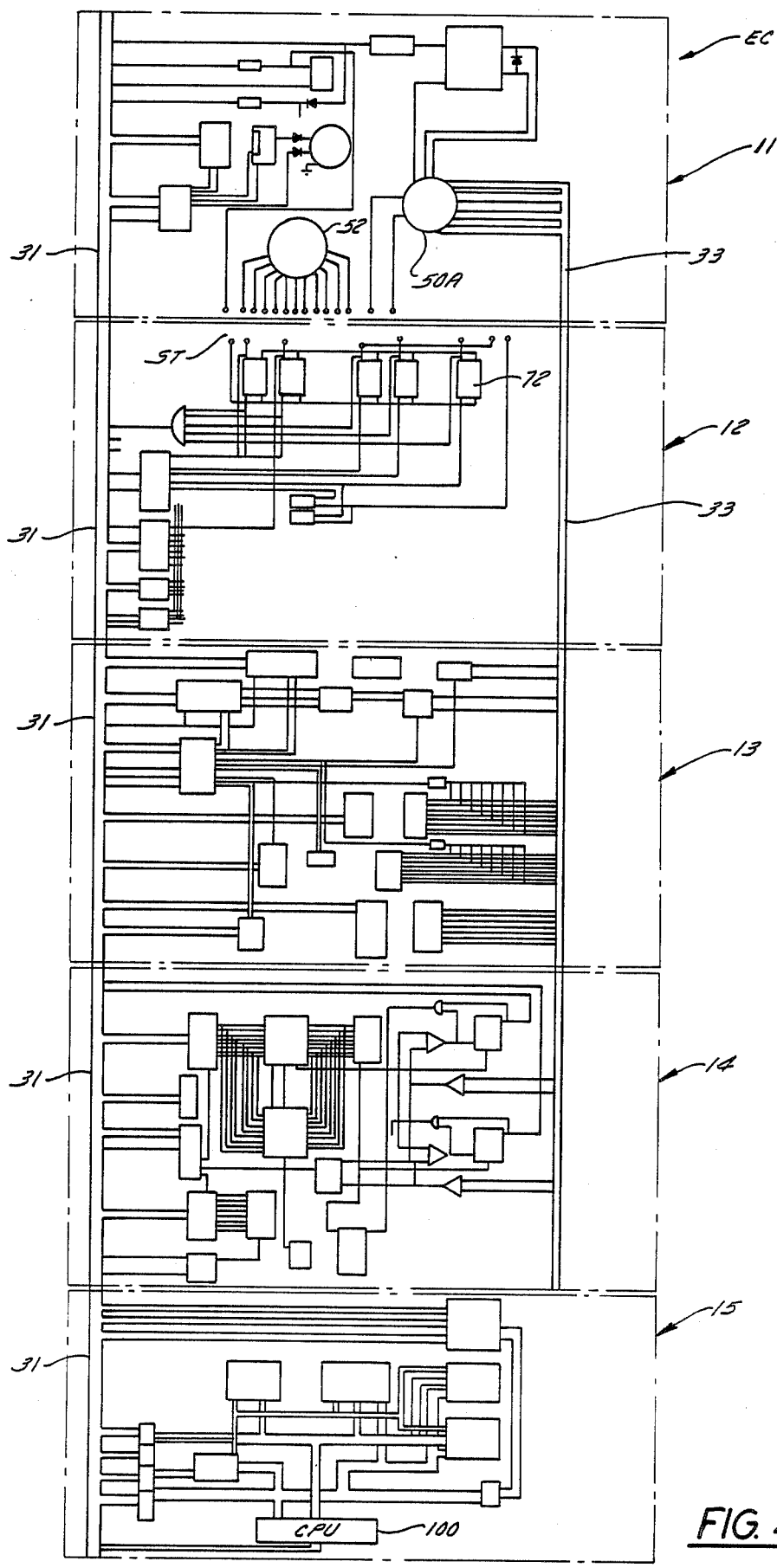
FIG. 4 is a schematic block diagram of the electronic control.
Figure 5A:
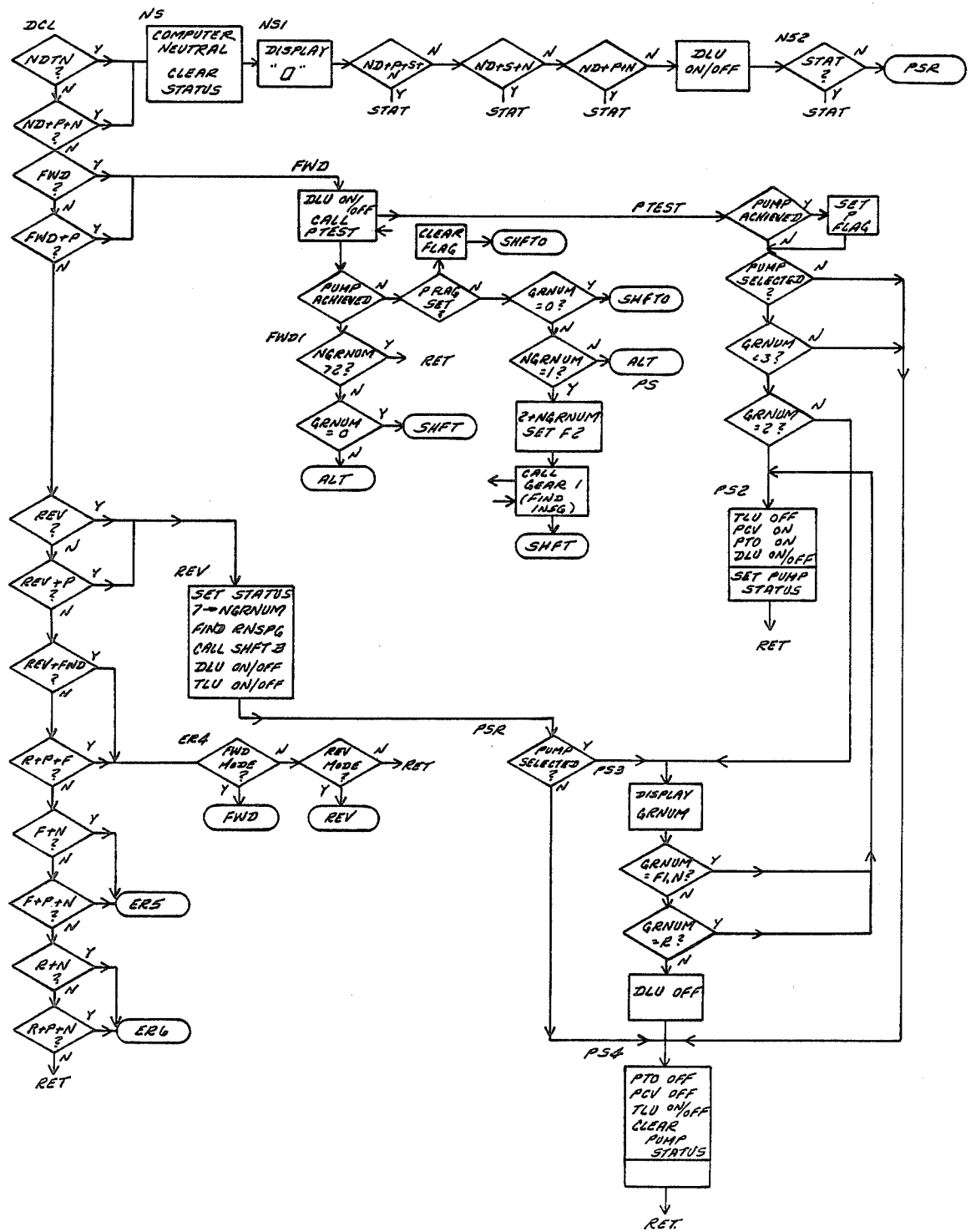
FIGS. 5A, 5B and 5C are logic flow charts of the functions and modes of operation of the electronic control.
Figure 5B:
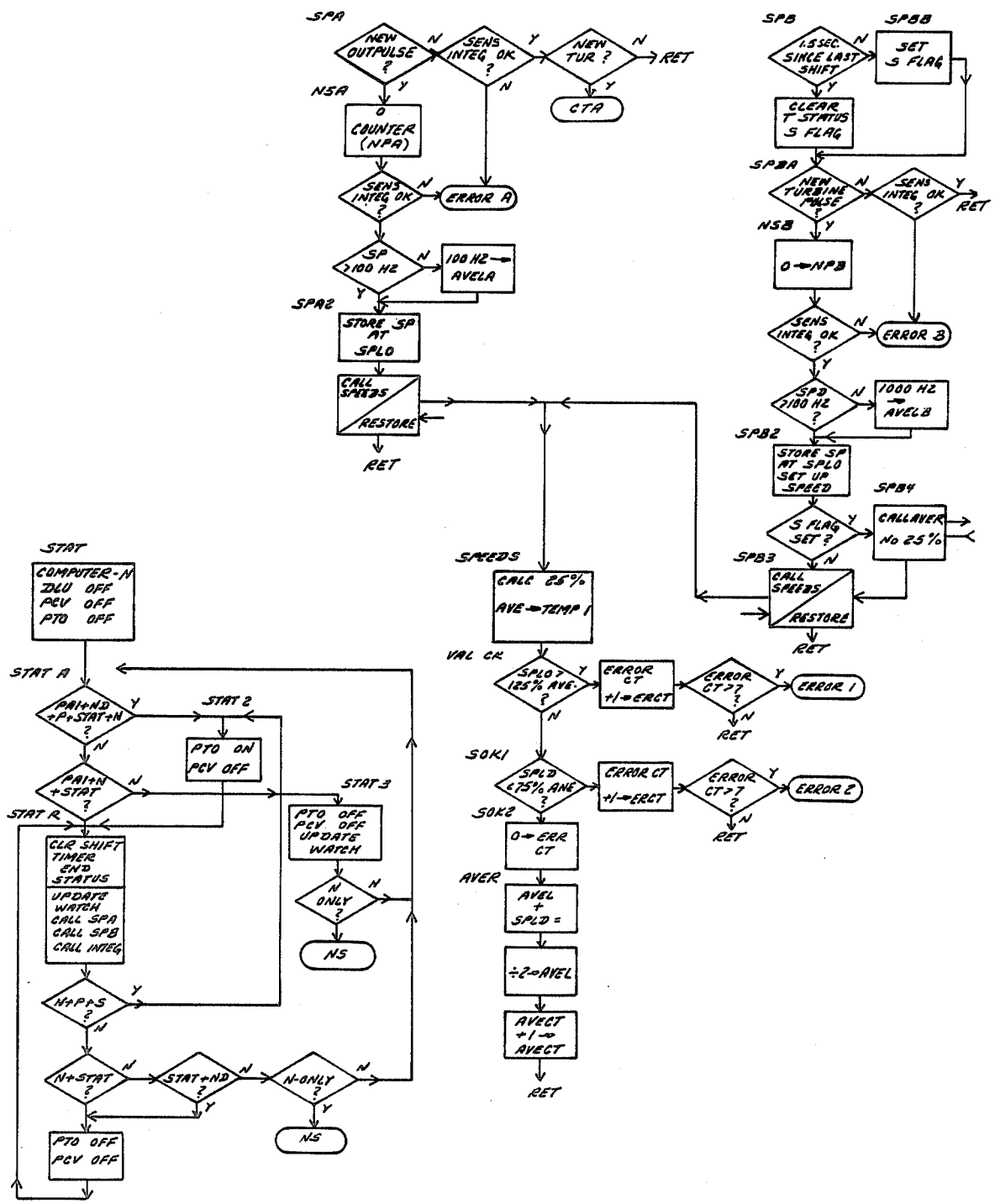
Figure 5C:
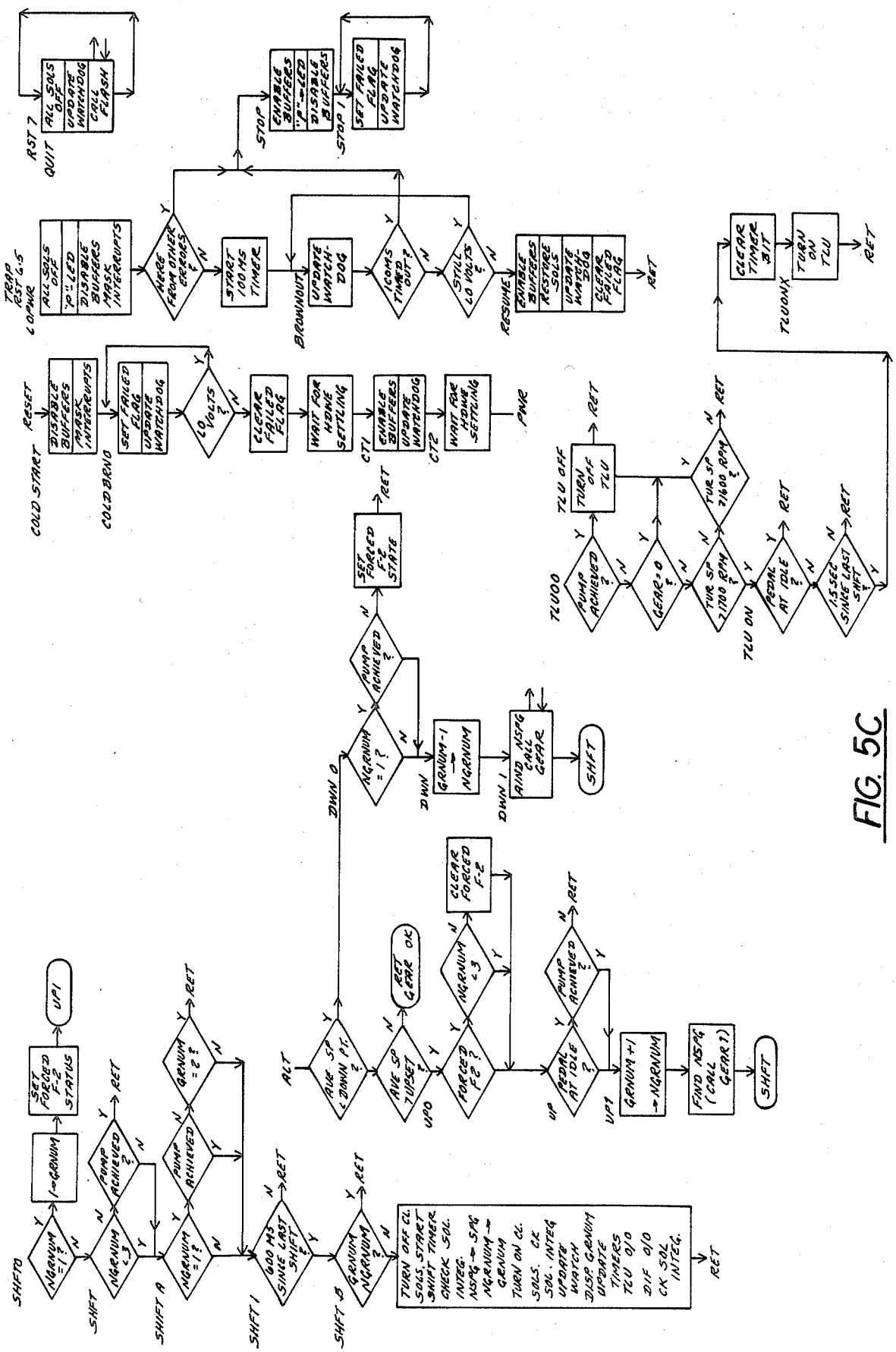

FIG. 4 shows in schematic form the general electrical arrangement between the five circuit boards employed in stack 10. FIG. 5 is a logic diagram of the functions carried out by the control EC. FIGS. 6 through 10 are more detailed schematic circuit diagrams of the five circuit boards FIG. 11 is similar to FIG. 6 but depicts another emobodiment of a connector board designated 11A which employs some components similar to those in connector board 11, as well as additional components.

Connector Board

Figure 11:
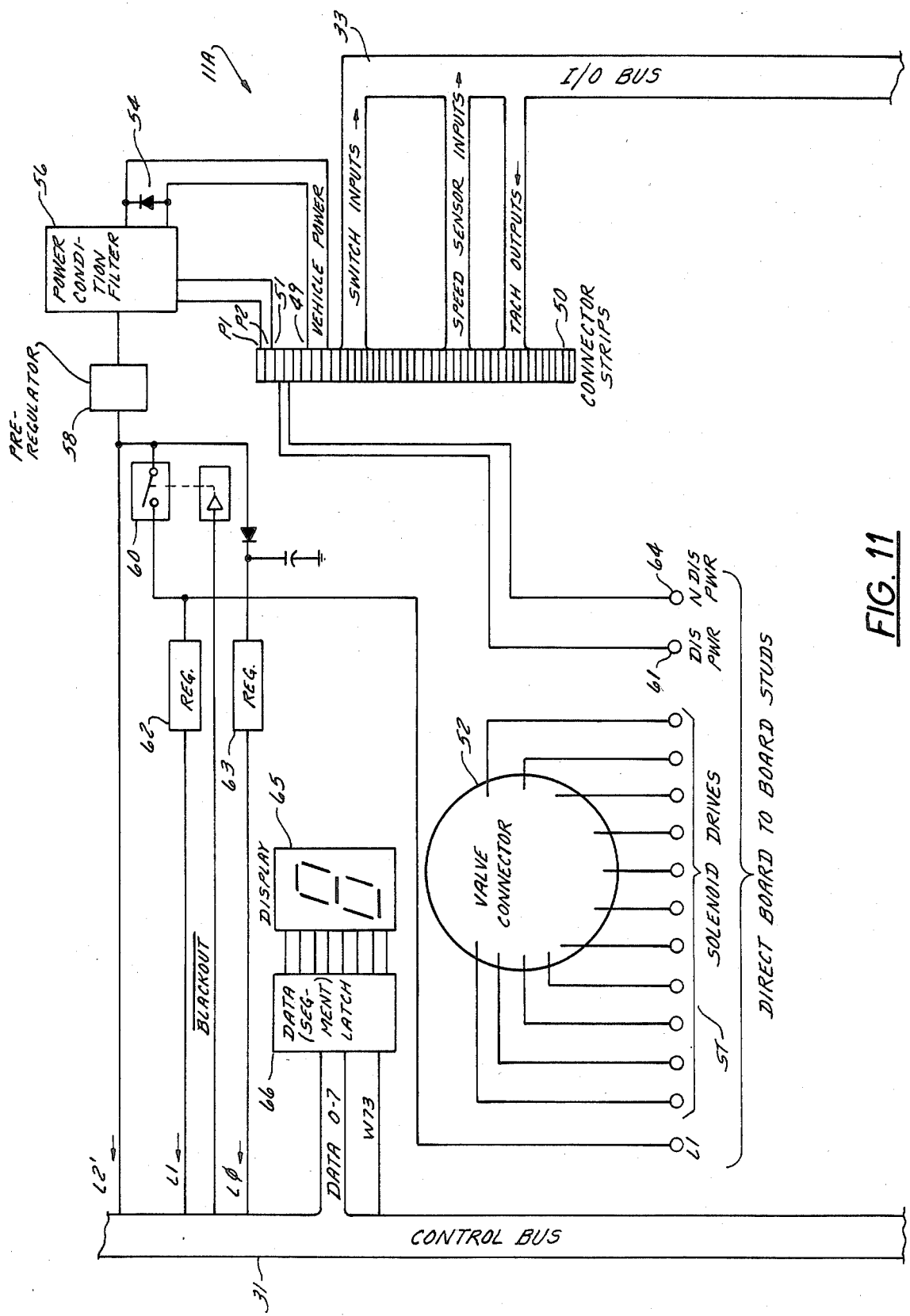
FIG. 11 is a showing similar to FIG. 6 of an alternative form of connector board.

The alternative connector board 11A shown in FIG. 11 comprises a connector strip 50, a power supply circuit 51, solenoid driver terminals ST which are connected to a tubular connector 52, a visual display device 65 and a latch circuit 66 for driving the display device.

Figure 6:
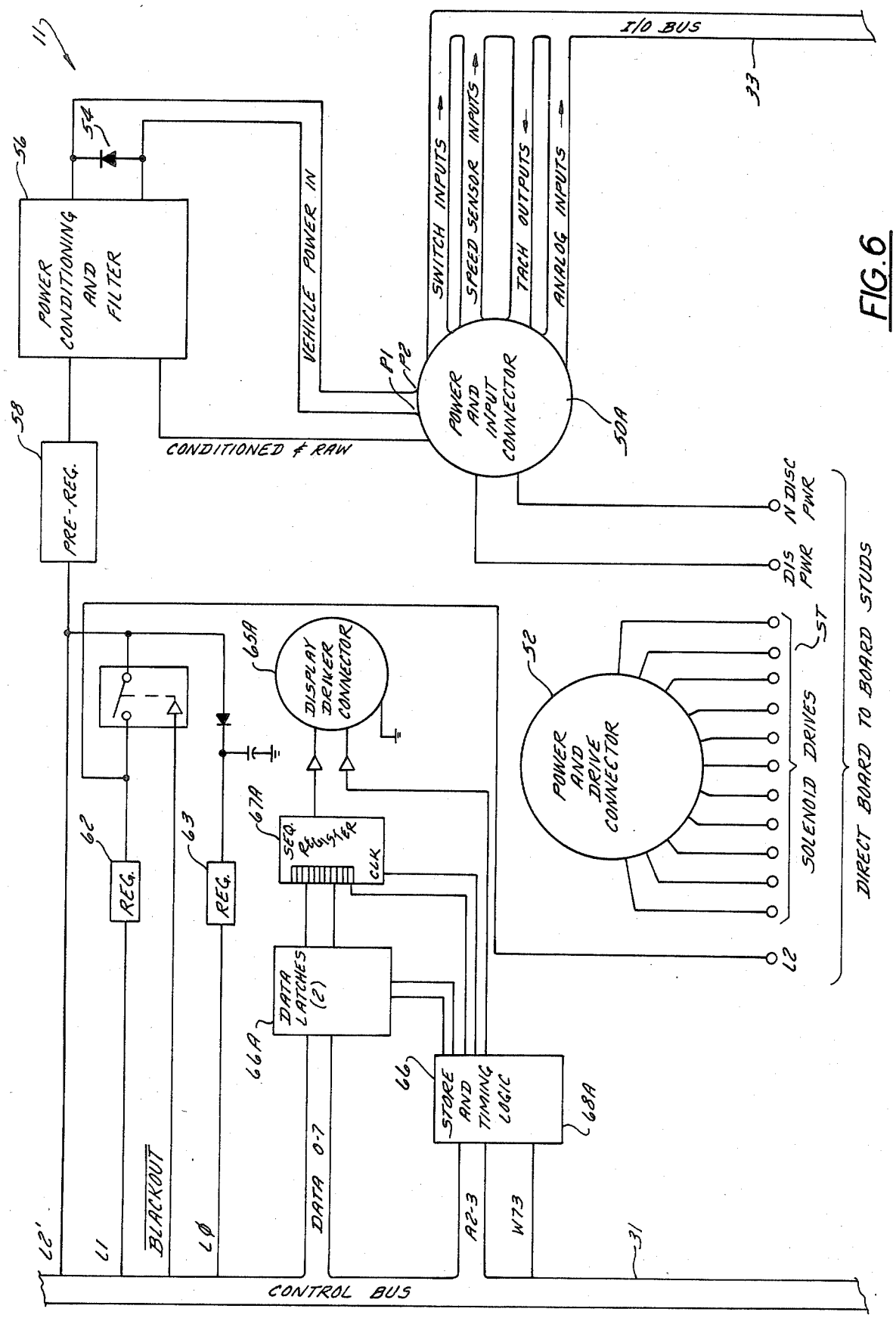
FIG. 6 is a simplified, partly schematic, circuit diagram of the connector board shown in FIG. 4.

The connector board 11 is shown in FIGS. 2, 3, 4 and 6 and differs from board 11A in that: it employs a circular connector 50A instead of a connector strip 50; it employs a display driver connector 65A for connection to and for driving visual display devices (not shown) located remotely from board 11; and it employs a more sophisticated and complex circuitry 66A for driving display devices, as hereinafter explained. Simmilar elements in FIGS. 6 and 11 are designated by the same reference numerals.

Referring to connector board 11A in FIG. 11, connector strip 50 has its terminals P1 and P2 connected to receive electric power from battery/generator BT (FIG. 1) and to deliver it to power supply circuit 56 for conditioning and distribution within control EC as hereinafter explained. Connector strip 50 is also connected to I/O bus 33 to receive electric input signals from the shift range selector switch ERS (switch inputs), from throttle position rheostat FPS (analog input), and from the speed sensor A (a series of pulsed or frequency type input) and to feed these signals to I/O bus 33.

Circular connector 52, which is of a conventional type and may comprise a metal or plastic housing, is adapted to accommodate a mating plug (not shown) on a cable (not shown) which supplies operating power to the transducer on the vehicle, i.e., the solenoids through.

Power supply terminals P1 and P2 of strip 50 supply power past a power reversal protection diode 54, through a power conditioning and filter circuit 56, through a power preregulator circuit 58, and through regulators 62 and 63 to power supply lines L0, L1, L2 and L2'. Terminals P1 and P2 also supply power directly to terminals 61 and 64 for supplying disconnectable and non-disconnectable power directly to output board 12.

Diode 54 is not a blocking diode but is a high current power reversal protection diode (rated at 30 to 300 amp peak) which is connected across terminals P1 and P2 and operates to blow a fuse (not shown) on the vehicle power supply or, if this does not occur, a fuse 67 in the power supply to strip 50, to protect the entire control EC against reverse power. Diode 54 avoids a one volt loss imposed on the 12-volt system inherent in use of a conventional blocking diode (not shown).

The pre-conditioning and filtering circuit 56 provides power (slightly conditioned against transients) to the disconnect and non-disconnect power circuitry terminals 61 and 64. The pre-regulator circuit 58 provides a nominal 10-volt regulated level on the line L2'. The non-switchable circuitry includes lines L2' and L0 and the disconnectable circuitry includes power line L1 and L2'. Line L2' goes directly to bus 31 and also through a switch 60 to a regulator 62 which supplies power to line L1. Line L2' also goes directly into a regulator 63 which provides power on a line L0. The input to the regulator 62 (the output from switch 60) also goes to a power supply terminal L2 which supplies power to the output board 12 and supplies power for the optical driving circuitry on the connector board 15.

Display device 65 is in the form of a seven-segment visual display device wherein each of the segments is independently driven from data latch 66. The data latch 66 is also a buffer and is written to (controlled) from the CPU board 15 providing independent drive of seven segments. The decimal point of the visual display drive 65 is optionally strapped to the data latch 66 as the eighth data item or can be directly powered from the L2' line as an indication that prime power is available on the vehicle, as in the embodiment of FIG. 11

Referring to FIG. 6 instead of the single seven-segment display device 65 directly driven from the CPU board 15, the output board 11 assumes a vehicle dashboard-mounted display device (not shown) having at least two digits, or possibly three digits wherein one digit may be a 14-bar that is fully alphanumeric and the other two digits are each 7-segment type displays. This latter arrangement requires a significantly higher intelligence transmitter or driving design. Thus, connector board 11A employs a multiple register circuit designed to be capable of up to four registers. Two registers such as 66A are outputed into two sequential shift registers such as 67A. The data latch or initial register 66A accepts information from the CPU board 15, latches it into place and continuously provides it to the input of the shift or sequential register 67A. The shift register 67A is driven from a timing and reset logic circuit 68A. The sequence of operation is as follows. At the beginning of a timing group there is a pause in the output clock in register 67A. This pause received at the other end forces a reset of all of the downstream circuitry by way of a missing pulse detector. Immediately after the pause during which a latch transfer or data transfer signal has been issued into the shift register 67A, the shift register 67A is clocked and provides its data in serial format to one of the buffers in the system. The other buffer in the display driving system provides the clock information to appropriately locate the transfer edge or to keep the validity of the data being transferred. The receiving device clocks this data in and, after a given number of counts, latches it into place broadside by delivering it to a set of decoding devices which then provides the display to the user.

The driving circuitry in FIG. 11 is so arranged as to be interchangeable between hard-wire and optical type information transfer. The drivers are designed such that the optical transmitters can be installed in place of the current loop which is used to drive an optical coupled receiver (not shown) at the display device. The second or clock line from the system could be eliminated and replaced by an F2F or Manchester style drive which would automatically provide the clock reference, the reset function and the data in a single line (not shown) which would be ideally suited for a high-speed optical system. Such a system could transmit not only display information to the user but also self-checking and internal system reporting information which would be decoded downstream according to the type of display being utilized. An operator's display device, for example, could decode only the operator's display information, including gear number, surface speed, etc., whereas, a technician's display device could decode additional information, including the state of certain lines without the CPU, the number of errors encountered, the operations between the CPU and the input board and the information received from the output board. Various other types of information could be of use in determining malfunctions or debugging new installations or providing an analytical tool for helping the user to determine how to improve the performance of the vehicle, as by establishing more ideal shift points, etc.

Output Board

Figure 7:
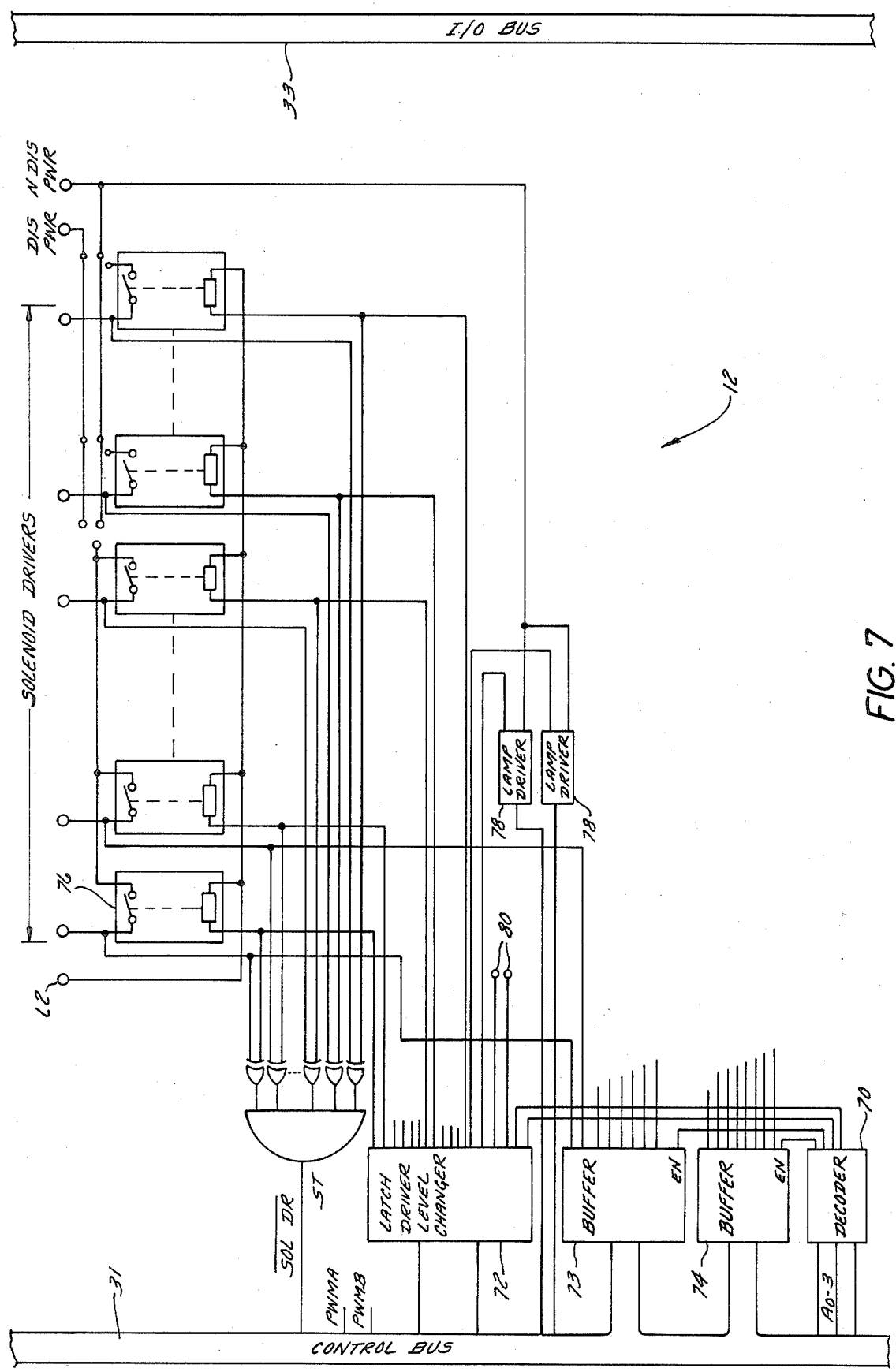
FIG. 7 is a simplified, partly schematic, circuit diagram of the output signal board shown in FIG. 4.

The output board 12 shown in FIGS. 4 and 7 is constructed and operates as follows. Output board 12 primarily comprises an address decode circuit 70, device enabling logic circuits, and buffer circuits 73 and 74. The decoder 70 is responsible for receiving the read 7 and write 7 lines and the addresses 0 through 3 from bus 31 and for providing a set of strobe or enable signals which turn on the appropriate devices to get information from the CPU board 15 locked into the output board 12 and to provide information from the output board 12 back to the CPU board 15 by way of the control bus 31. The output board 12 shown is capable of handling 16 total outputs and is provided, for example, with twelve solenoid drivers such as 76, two voltage constant lamp drivers such as 78, and two general purpose outputs.

The two buffer circuits 73 and 74 labeled "all drivers" and "all outputs", respectively, are actually feeding back into the control bus 31 the information read from the output state of the drivers 76, 78, 80 and from the output state of the stages. This inforamtion is useful whenever a solenoid error is detected. By knowing the state of the drivers and knowing the state of the outputs, the CPU board 15 can determine which state has failed. Electronic Control EC can be provided with enough logic circuitry to work around such a failed solenoid valve. If that requires skipping over a gear or modifying the shift pattern of the vehicle, those further capabilities can be built into a miscellaneous board (not shown) for the controller EC, as long as the aforedescribed hardware or firmware has been furnished to provide the CPU board 15 with the intelligence necessary.

Figure 12:
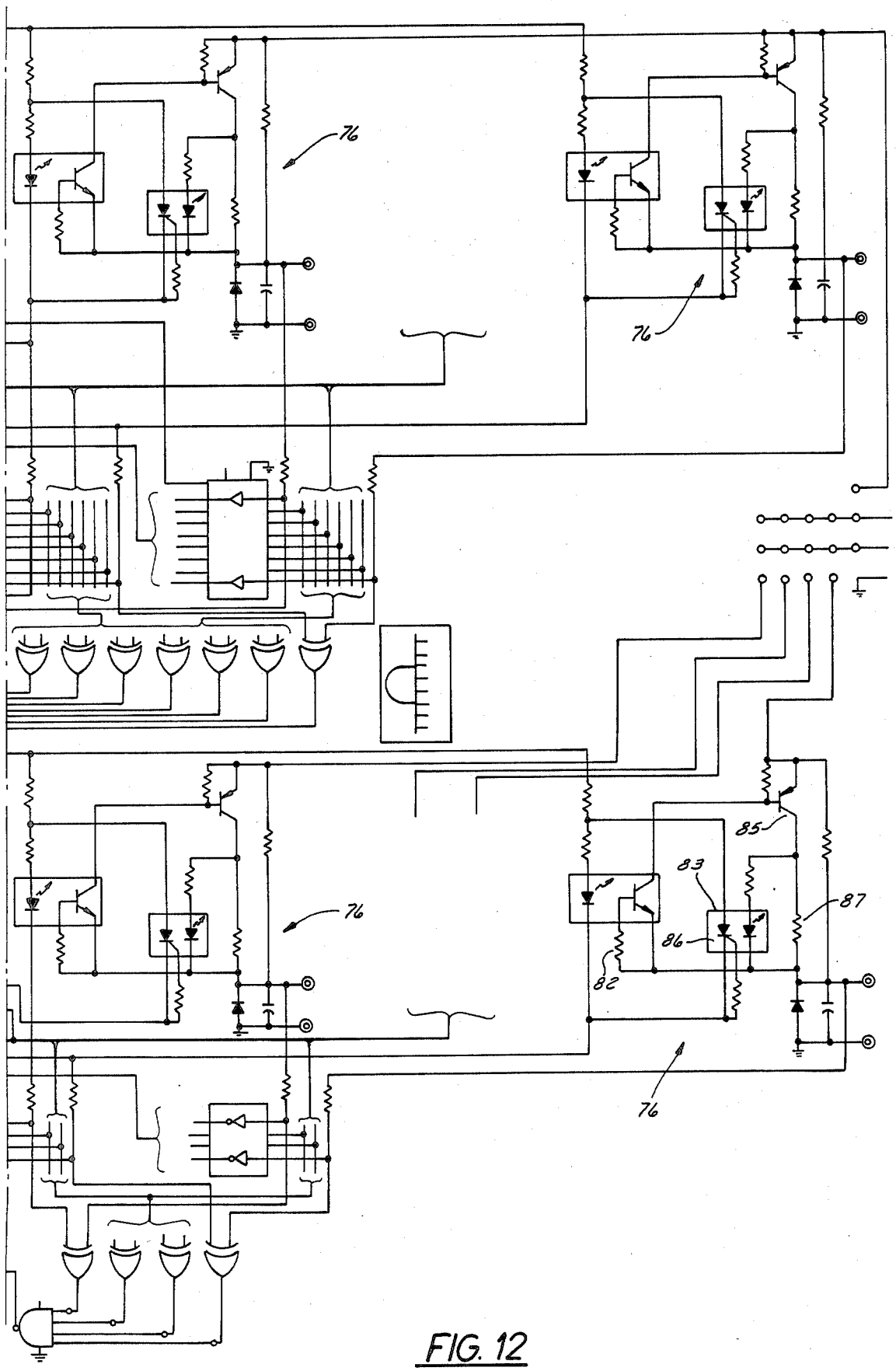
FIG. 12 is an electric circuit diagram of a circuit element shown schematically in FIG. 7.

A sublock 72 labeled "latch driver level changer" comprises two 8-bit latches with high-power drivers. The outputs of these drivers go to the solenoid power driving stages 76, and to the lamp drivers 78 and two of them are provided for a strappable option connection 80 for general purpose use. As FIG. 12 shows, solenoid driving output stage 76 is provided with two optically coupled devices 82 and 83. One optical device 82 couples the drive command from the latch driver and level changer 72 to the power output transistor stage 85 power levels. The second optical device 83 couples a current feedback sensing signal at 87 to an SCR 86. The SCR 86 in the second optical coupler can short out the drive command being processed by the first optical coupler 82. This provides an optically cross coupled system wherein a condition existing at the output which would demand too much current from the power stage can initiate a self-resetting mode of operation. The signal at 87 will in fact trigger the SCR 86 in the second device 83 which shorts out the driver to the first device, which in turn removes the drive to the power stage. As long as the signal to the latch driver 72 is present, the SCR 86 will be maintained. The SCR 86 will be allowed to turn off as soon as the drive output command has been removed by the CPU. Once the SCR has recovered, the stage is again capable of attempting operation the next time it is told to turn on. The stage can thereby be described as a current-sensitive self-resetting power stage. This is an important feature of electronic control EC and is a very powerful asset to the entire system.

Each of the output stages is passed back to an exclusive OR network for sampling and comparison of the drive input signal to the drive output signal. If the input drive signal is low, it indicates that it is driving and the output signal should be correspondingly high. Conversely, if the input drive signal is high, it indicates that it is not driving and the output signal should be low or non-driving. Thus, regardless of whether the driver is driving or not, one of the two signals (either the input driver or the output drive signal) from the power stage should always be high. By passing these signals through an exclusive OR network, the output of the exclusive OR network must always be high. Should the power stage fail, then there will be a situation where the input drive signal could be high (i.e., off or non-driving), and the output drive signal (i.e., the output of the power stage) would also be high because, for example, of a shorted power transistor. Under this condition the exclusive OR terms indicates that the output of the exclusive OR gate will be zero. Likewise, if for some reason a solenoid valve becomes shorted, then during the time when one expects to get an output drive, the output transistor would be trying to drive into a zero voltage situation. This should at first be corrected by the self-triggering or self-shutting down of the optically coupled network. The CPU would then sense this situation because there would be no output at the output of the power transistor yet the output of the driver circuit would be low or driving and since both input terms to the exclusive OR would be low, the output would be low. The outputs of all of the exclusive ORs are tied into a common AND input gate. This implies that all of the input terms must be high to maintain the output of the AND gate high. The output line known 'SOLER' or solenoid error is fed back to the CPU and is monitored by the CPU in soft managed function. It is not used as an interrupt. The main reason it is not used as an interrupt is that in many situations the speed of the circuitries involved are not ideally matched; that is, the power devices are quite large junction-wise and upon being given a command by the driver between processing through the optically coupled networks and turning the power device itself, there is a significant amount of time lost in the order of a microsecond. During this period of time the driver output is low yet the power stage output has not yet gone high. This situation would lead to a condition called spiking or transient conditions in which the SOLER line may noise or may spike to an erred situation only due to the transient time in the circuitry itself. The transition time from when it is given a command until when it processes that command. Because of these possibilities SOLER was fed into a testible line by the CPU so that it could at regular intervals and under control of the program monitor this line and not be interferred with by this line unless it was significant.

Two alternate inputs to the output board 12 are PWM A and B. These latter two inputs can be strapped into the first two output stages in place of the driver, level changer outputs. These two imputs PWM A and B when they are active would be coming from the duty cycle board 14, or from a modulating board (now shown).

The two lamp drivers 78 provided on output board 12 are actually voltage regulators (such as twelve volt regulators, for example) and are switched on by the action of the latch driver level changer circuit 72. The outputs from the driver 78 are axially passed back to the connector board 11 on the control bus 31 as a matter of physical convenience; however, they are not actually control signals. The actual placement of the devices they power is such that is would be inconvenient to take them over to the I/O bus 33 card. The drivers 78 could be interchangeable with alternate outputs from the latch driver level changer circuit 72 and/or are replaceable with full voltage drivers (not shown).

FIGS. 4, 6, 7 and 11 show two terminals designated DIS PWR and N DIS PWR, and these designations are abbreviations for disconnectable power and non-disconnectable power supplies. It should be noted that five of the stages of output board 12 are strappable selectively to either disconnectable or non-disconnectable power. The remaining seven stages of board 12 are common connected but that common connection is individually strappable to either the disconnectable or non-disconnectable power supply. This provides for a situation wherein the output board 12 can be readily configured to many different combinations of disconnectable and non-disconnectable powering for solenoids which provide various functions, such as for example, transmission operations, latch plate control, forceable neutral drive pumping solenoid functions and other functions which a user may from time-to-time decide need to be either disconnectably powered or non-disconnectably powered. Generally speaking, disconnectably powered devices have their power removed at such time as the vehicle is forced into neutral or depends on a pedal-push type operation.

The other terminals in FIGS. 6 and 7 labeled solenoid driver terminals ST are connections being taken directly to the connector board 11. Terminal L2 also identified is the highest of the regulated power supply lines and provides the power for the optical driving network driven from the latch driver level changer 72. Terminal L2 is brought directly to the connector board 11 by way of a stud for the reason that a stud/screw combination connection can accommodate a high current level and the problems of corrosion and contamination are avoided.

CPU Board

Figure 10:
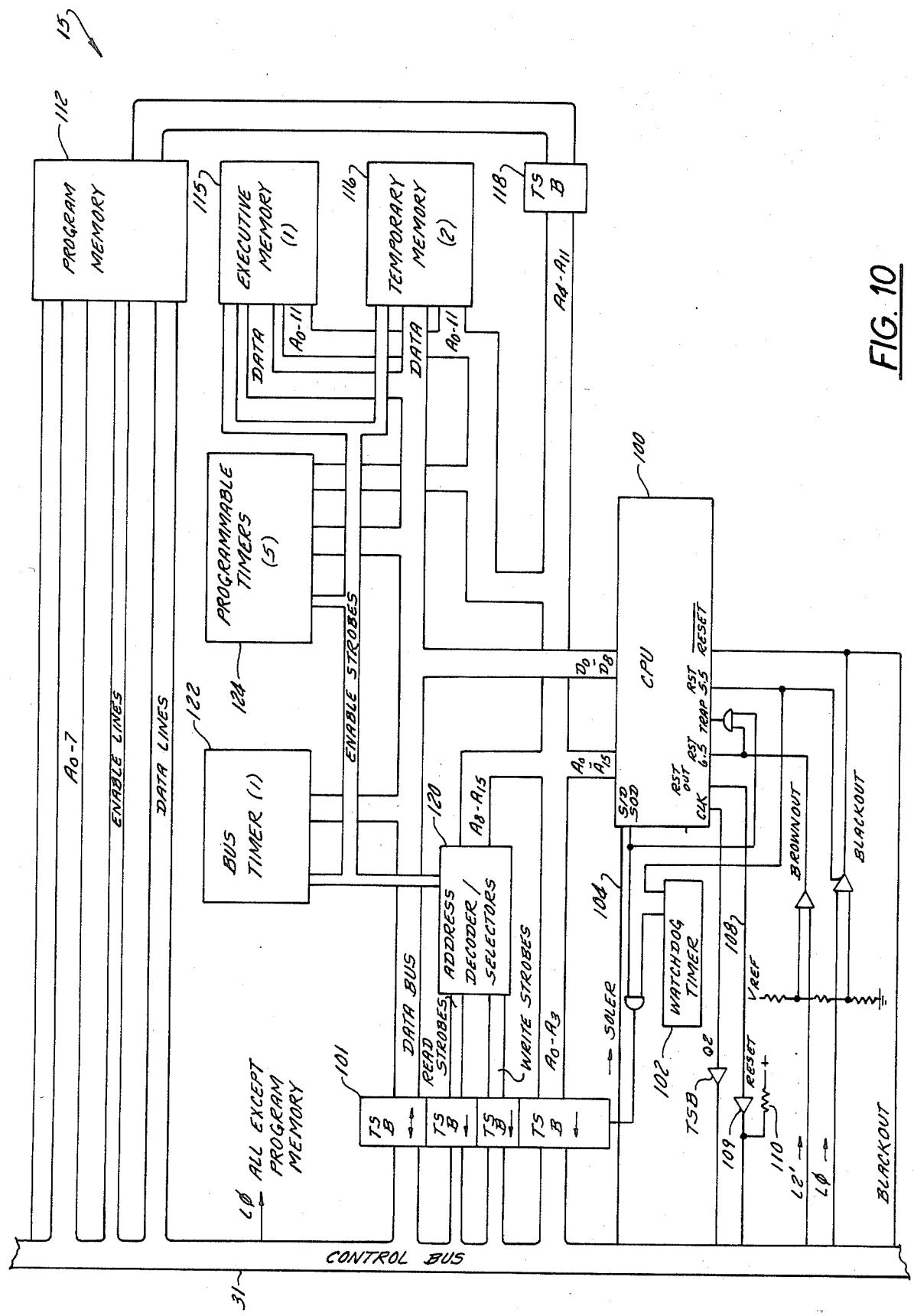
FIG. 10 is a simplified, partly schematic, circuit diagram of the CPU board shown in FIG. 4.

The CPU board 15 shown in FIGS. 4 and 10 is constructed and operates as follows. This board employs a solid state CPU device 100 such as a 80C85 CM)S type device which, as contrasted to a NMOS or bipolar type device, remains energized and on line at voltages as low as 3.5 to 4 volts and has the highest possible survival capability during power outage or power interruption. Preferably, all prime operation and computing circuits in electronic control EC employ. CMOS type devices, except those outside the prime computing section, so that in case of low power availability, as during brown-out or during processing of power down/power up, the CMOS devices ride or remain on the system as long as possible. The CPU device 100 becomes energized before any of the higher power components and is, therefore, in control of the system during power up. The CPU device 100 resets by way of a "blackout" signal on line LO and enables the bus by way of a tristating control 101 to which it provides signals through a watchdog timer 102 and from the SOD (serial output data) line 104. The tristate control 101 allows shut down of the control bus 31 which eminates upward from the CPU device 100. Bus 31 is provided with a reset out signal which also exits from the CPU device 100 on a line 108. The reset out signal on line 108 is driven by the tristate control 101. The outgoing side of a tristate buffer 109 that handles resets is provided with a pullup resistor 110. When this control buffer 109 is tristated, the pullup resistor 110 will automatically apply a reset to the remainder of the system the remainder of the system. This arrangement has been used throughout the control EC to provide a forceful "reset-to-safe" condition on those boards which are allowed to power down or which can be shut off functionally during the time that adequate power is not available to provide positive functioning of the system.

CPU board 15 comprises a large program memory circuit 112 in the form of a NMOS (or CMOS) chip that can store large quantities of date at the expense of greater power, and is, therefore, located outside of the CPU lower power cluster on CPU board 15, namely, an executive memory 115 and temporary memory 116 which must function from the very beginning until the very end of system operation. The program memory circuit 112 receives its connections, its information, its signals and enable signals from the control bus 31 and from one additional set of tristate buffers 118 which provide A4 through A11 address lines to the program memory 112 and only the program memory. The A0 through A3 signals are provided to the entire control bus 31 and are used by most of the circuit boards to divide up their entire area into a minimum of 16 levels. The A0 through A3 four-bit signals allow a binary possibility for 16 different combinations which can be selected.

The CPU board 15 comprises an address decoder/selector 120 similar to those used throughout the system and sometimes called "enables" or "strobes" which has the function of using incoming address or binary information and providing a selection of one of N at the output. The decoder 120 decodes signals A8 through A15 and provides a group of selections which involve the upper address lines A12 through A15, decoded enable signals A8, 9 and 10, and read and write separately into individual decoder chips. This provides eight read strobes and eight write strobes for the control bus 31, and eight read/write strobes for the CPU board. Each read strobe and write strobe provided in to the control bus 31 can enable a decoder on some other circuit board. The additional decoders can be provided with signals A0 through A3, the four lower address lines, and can pick any one of eight possible read or write decodes. Signal A3 can be used as an on/off signal or a bank select signal to talk to a second decoder and reach an additional eight devices. Ther may be a condition where it is advantageous to use signal A3 to allow a discrete decoder which accesses as many different types of devices and an integral decoder, such as the analog to digital converting input section on circuit board 15. The read strobes and write strobes are literally macro selectors, that is, they are strobes which are caused by higher address lines and can subsequently be broken down by signals A0 through A3 into a maximum of 16 possible selections on any one board where bank decodes (not shown) have been so designed. The CPU board 15 also has a bank of five programmable timers 124 which take the form timers directly accessible by the CPU device 100 and located in the executive group where they can survive minimum possible power levels. There is an additional direct or bus timer 122 which the CPU device 100 accesses as a location, which receives data from the bus 31 and which has only one input, namely, a reset. After the CPU 100 resets the bus timer 122, it starts counting at a predetermined rate, preferably 100 microseconds or 0.1 millisecond. The bus timer 122 is a general purpose device but requires additional firmware if more than one component is going to be timed because it cannot be reset while simultaneously keeping track of a timed event.

Temporary memory 116 in the executive group is a CMOS static RAM chip type RCA 1823 read/write random access memory using the address from the CPU bus A0-11 and taking data in or out according to the read/write condition lines. The executive memory 115 also using address from the CPU bus A0-11 can be an EEPROM, i.e., an electrically programmable and erasable device. Memory 115 is shown using only an EPROM, but it could include an onboard write strobe capability and a plug-in provision so that the executive memory 115 could be reprogrammed without being removed from the system. The executive memory 115 is a CMOS device having a wide voltage range and stays active along with the CPU device 100 until the lowest possible level feasible. The executive memory 115 has programmed in it the various routines such as: watching for reset conditions, checking after a reset of the CPU device 100 to determine whether the CPU has been operating and has gone through a "brown-out" operation (i.e., power shortage, or a power transient, or power interruption). Under these conditions the executive memory 115 has a minimum amount of firmware which allows it to check the condition of certain programmable timers to see if the time elapsed since the CPU device 100 stopped functioning in the main program memory has exceeded a predetermined interval. If this predetermined interval is exceeded, the CPU device 100 can force the system to reset, that is to say, force all of the solenoids back to neutral gear conditions, force the vehicle operator to do something, or simply shut off the system and force a power down and full restart. If the elapsed time is within the allowable time interval for a power interrupt, then the executive memory device 115 has enough firmware space to provide for an orderly restart and a continuation of control at the point where it left off. It should be noted that during the time of a "brown-out", the bus 31 is absolutely shut down and a force reset signal is put on the bus 31. During this forced reset period, all outputs to solenoid valves ST are shut off. So, for example, if the interruption was for 10 milliseconds, that amount of time is shorter than the amount of time it takes the solenoids to actually physically start turning off. Therefore, it would not be necessary to shut down the entire transmission system or to even force a gear selection restart because any solenoid which had been "on," could not yet have turned "off". The executive memory 115 is adapted to include a system self-test program which, for example, would allow a user to change a jumper (not shown) on the CPU board 15 or in connector 65A so that the next time the electric power is turned "on", the system would start up in a self-test routine and the operator, by watching the conditions of solenoids and operating switches on the vehicle, would obtain rudimentary knowledge to determine the functionality of the CPU device 100, the main driver or output board 12, the input board 13 and all of the critical functioning components associated with the control EC.

The hereinbefore-mentioned watchdog timer 102 is a retriggerable one shot that is activated, triggered or clocked by an address selection whenever a given address in the system memory is accessed. The firmware is so designed that the watchdog timer 102 is expected to be retriggered and is clocked again before its timer period runs out. By selection and design, timer 102 is of the type of one shot which will continue the Q output in the high state as long as it continues to be retriggered. If for some reason the program does not get to the retrigger point or does not pass through one of the points which retriggers the one shot, the watchdog timer 102 will run out of Q output and will time out. This will cause a suspension of the tristate bus. It will also provide a signal into the CPU device 100 which forces the CPU to cease execution of the program from program memroy 12 and will, simultaneously by suspending the bus, force a reset onto the bus line 31 which will then immediately suspend the solenoid logic and power to all critical solenoid drivers. The watchdog timer 102 is managed by firmware in the executive memory 115 and by the program memory 112. The executive memory 115 has no need to continually handle the watchdog timer 102 for the following reasons. The watchdog timer 102 cannot prevent access to the executive memory 115 since the watchdog timer can only tri-state the external bus 31. The CPU device 100 must be able to sense the trap lines during the power up and determine whether the executive memory 115 has been recalled or activated again; such activation resulting because the watchdog timer has timed out, or because there had been a short power interruption, or because the power is just then being turned "on" to the vehicle.

The lines L2' and L0 shown in FIG. 10 as coming into the CPU device 100 process information known as "brown-out" and "black-out". A reference voltage is divided to determine the critical levels for brown-out and black-out and the lines L2' and L0 are compared, respectively, to determine the state of those signals. When a brown-out is sensed, the CPU device 100 will drop the voltage level of the SOD line 104. That lower voltage level will cause a suspension of the tristate bus and a reset of all peripheral devices (but not reset the CPU). The low voltage will only cause the CPU device 100 to exercise a restart trap operation in which it continues to run and continuously monitors the condition of vehicle electric power to determine when it is safe to re-apply the bus logic, the bus drivers and to re-enter the program memory.

FIG. 10 shows the line L0 going to all circuitry except the program memory 112. The line L0 indicates the most supportive voltage which would survive the longest in the case of vanishing vehicle power or a brown-out situation and can continuously provide power while the other supply lines have already lost power. The line L0, which has its own filter, is arranged so that it is decoupled by a diode (not shown) from the main support lines L1 and L2 and L2' for the remainder of the system.

As previously explained, power can be removed from the integrated circuits and devices found on the other circuit boards, yet must remain as long as possible on the CPU board 15 and on the devices associated with it. It is necessary, therefore, to use the completely tristating bus buffers 101. The buffers 101 are so managed that the bus 31 would be tristated before the black-out command line is driven to shut down or switch down the power to the remainder of the devices. The sequence on power-up is the reverse. When power is applied, the tristate control 101 is immediately supplied. As the power continues to come up, the black-out command is removed, the watchdog is activated and the power is switched on to the devices of all other circuit boards and as the voltage continues to rise, the tristate line or tristate command is removed and the bus 31 is enabled. This sequence enables decoupling of the CPU board 15 and allows it to ignore what is happening in the rest of the system and remain as functional as possible for as long as possible.

Duty Cycle Board

Figure 9:
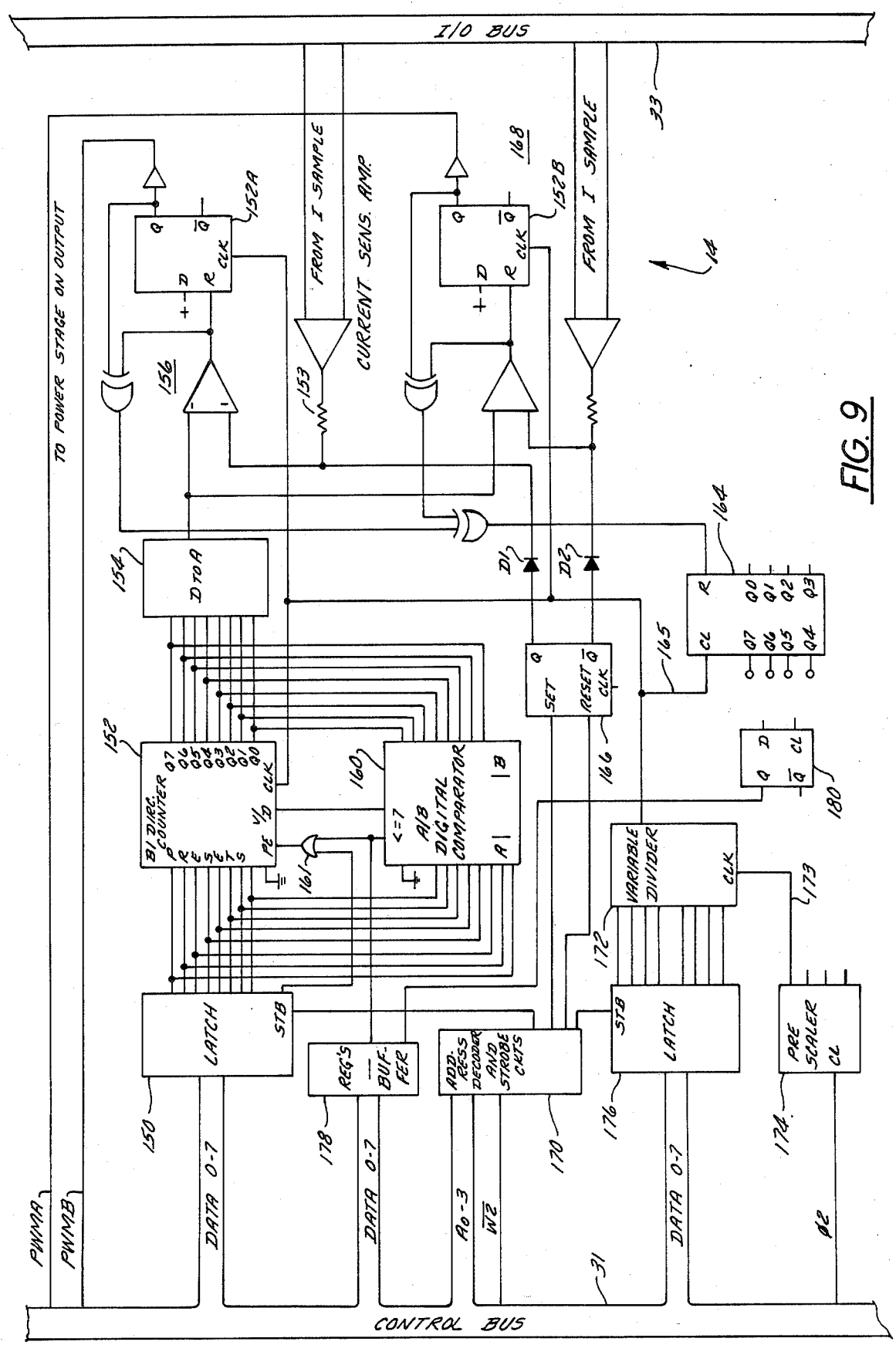
FIG. 9 is a simplified, partly schematic, circuit diagram of the duty cycle board shown in FIG. 4.

The duty cycle board 14 shown in FIGS. 4 and 9 is constructed and operates as follows. Duty cycle board 14, which may be referred to as a "miscellaneous" board, is constructed to receive IC components and is adapted to be hand-wired to suit various configurations required in particular apparatus in which the control EC is employed. Board 14 is shown as comprising a data latch 150, a counter 152, a digital-to-analog (D-A) converter 154, comparator circuits 156 and 168, pulse-width modulating lines PWMA and PWMB, a digital comparator 160, a saturation detector circuit 162, a saturation counter 164, a reset gate 166, an address decode circuit 170, a variable rate divider 172, a prescaler clock 174, a latch 176, a buffer 178 and a toggle or D gate 180.

Coming into the data latch 150 from the CPU board 15 is a signal indicative of the desired output level of current to the solenoids. This level is in terms of the percentage current from zero to 100 percent (i.e., from zero to 256 count signals). The CPU board 15 latches into the duty cycle board 14 and, in the eight bits that it deposits there, it tells the circuitry in terms of zero to 100 percent what current should be established at the output. The CPU board 15 also provides one lowest order bit which tells the board 14 whether it should immediately try to achieve that current or whether it should ramp up or down to that current by way of the ramping circuitry provided on the duty cycle board 14. If it is decided that it wants an immediately change to the current level desired (a "jam"), it sets the lowest order bit high. This forces a preset in the bi-directional counter 152 which is connected to the latch 150. The counter 152 presets to the binary value which is latched into the data section of the latch 150. The output of the counter 152 then immediately achieves that level and passes it into the D-A converter 154.

The digital-to-analog converter 154 outputs the count as a voltage level. The voltage level is then compared to a voltage level coming back from a current sampling resistor 153 and an amplifier circuit 162 B. This amplified voltage level is scaled for the appropriate solenoid (or modulating valve) which is being used or controlled by control EC. The comparator 156 compares these two voltages and, if the current level currently sensed is not as high as the current level being desired, comparator 156 forces an "on" condition to the power stage on out by way of the pulse width modulating line PWMB. The upper stage comparator 156 drives PWMB. The lower stage comparator 168 drives modulating line PWMA. These are alternate input signals that are fed to and processed by the output board 12. The same output stages, the same optically coupled self-resetting drive stages which are used for standard solenoid duty are also used for these modulating stages.

Turning again to the latch circuit 150, if it is desirable to have the circuitry ramp up or down at some given rate to achieve the desired current level, then the lowest order bit is left off. If the lowest order bit is left off, the preset function is disabled and the bi-directional counter 152 is now actuated by way of the up/down command from the digital comparator 160 to count itself up or down to the desired output count. That count, of course, is then converted to a current level signal.

The digital comparator 160 sees output of the latch circuitry 150 which is also the input of the counter 152 and the output of the counter 152 which is the input to the D-A converter 154. A comparator "greater-than-output" signal goes back to the up/down command. The comparator 160 outputs are with reference to the A side of the inputs A and B. The "greater-than-output" is wired to up/down terminal of the counter 152. This would mean that counter 152 counts up when the A side of the comparator 160 is greater than the B side of the comparator 160. These are typically identified on logical symbols as: A greater than B; A equals B; A less than B; etc. The digital comparator circuit 160 "equal than" condition is wired into an OR gate 161 which processes into preset enable terminal PE of bi-directional counter 152 to perform a clamping function. When the counter 152 counts itself up or down to the point where the output of the counter 152 matches the input to the counter from the latch 150, then the equality condition is reached. As a result, the comparator 160 forces equality "high", which presets the bi-directional counter 152 or holds it at the current input level, otherwise the counter 152 would continuously cycle one count above to one count below the input latch condition and such high speed cycling is not desirable. The equality line from the comparator 160 is also fed out to outgoing buffer register 178 so that it can be read by the CPU circuit 100 on board 15. This allows the CPU device 100 to determine whether the modulating circuitry has achieved a given current level which it desires the particular solenoid valve to be at.

Another component on duty cycle board 14 which is tied back to the current level comparator 156 and 168 is a saturation detector circuit 162 which includes saturation counter 164. Saturation counter 164, which is reset whenever the desired current is achieved for whichever stage is being operated, is clocked from the same drive line 165 which counts. The saturation counter 164, which is reset by the output from the current level comparators 156 and 168 whenever the desired current is reached, is clocked from the same line 165 which provides the counting signal to the bi-directional counter 152 and clocks the current comparator latches 152A and B in the actual drive stages for PWMA and PWMB. The saturation counter 164 works in the following manner. A desired level of count is strapped into the toggle D gate 180. When a new command, especially a command calling for greater current, is given to the output drive, the circuitry turns on the pulse modulating stage and waits for the current from the sample resistor to reach the appropriate level. If there is a significant amount of current difference between where the stage currently is and where it needs to be, the inductance in the solenoid coil loop provides a time constant. Thinking of it in terms of a flywheel, the effect is that it will take some time to put enough energy into the system to make it respond to a level of power currently available. The output stages are driven on the inductance of the coil and this prevents the current from rising immediately as it would if it were a resistance circuit. This means that, at the rate that the bi-directional counter is being clocked, the current from the sample resistor may not reach a suitable level to trigger the toggle 152A and drive the output stages PWMA and PWMB "off," so that these stages will actually remain set for several counts. If they are set for a time exceeding the selected time from the saturation counter, the D gate 166 following the saturation counter 164 and strapped to it will get toggled and when it gets toggled that information will be provided back to the CPU device 100. Normally, a completely de-energized modulating solenoid may take as many as 32 cycles of the modulating circuitry before it reaches an 80 to 90 percent current command, so it is typical to have the saturation counter set somewhere around 32 clock periods to 40 or 50 clock periods. Once the current in the modulating valve has reached the desired level, the process that follows is relatively simple. The clock from divider 172 which is provided to the bi-directional counter 152 is also provided to clock a D gate 152A or B whose output drives PWMA or PWMB, depending upon which is selected to operate.

The clock would clock the Q level of that gate "on", if the current at the modulating level is below the desired level. When the current reaches the desired level, the output of the comparator 160 goes high. That output is tied to the reset of the D gate which then shuts down the Q output of the D gate; so once a load has reached the desired current level, there is a succession of clock pulses and resets usually occurring within the cycle time. That is, within the clock positive edge cycling time we would get a positive edge cycle, Q would turn on, shortly thereafter the current would modulate upward slightly and trip the comparator 160. The comparator 160 would reset the gate and Q would shut off. This tickling or continuous replenishing of the current is actually an adaptive process, that is, it is not at a fixed duty cycle. It is based on achieving a given current level and as the system voltages vary as the line resistances vary, i.e, due to bad connectors or due to additional reactance at the modulating valve itself by changes in hydraulic pressure, the duty cycle can vary back and forth to keep the current at the desired level or at the power input to the modulating device at the desired level.

Either PWMA or PWMB may be chosen. Notice that just above the saturation counter circuit there is a set-reset gate 166. The outputs Q and $\overline{Q}$ from gate 166 are connected through diodes D1 and D2 into the current amp outputs 156 and 168. The outputs Q and $\overline{Q}$ are capable of pulling up or driving up the current amplifier outputs to force a continuous reset of one side or the other. The way the system works is that the voltage level of the D-A converter 154 is continuously provided to both of the comparators. Terminals Q or $\overline{Q}$ from the reset gate 166 will be high, and whichever is high will provide continuous high drive or high level signals into the non-inverting side of the comparator 160 which will force a continuous reset to the associated PWM (A or B) output driver. In this manner, disabling one stage or the other as desired by the CPU device 100 is achieved. It is assumed that transmission T disclosed herein has only two modulating valves V1 and V2. However, this same approach could be used for more than two modulating valves by replacing the set-reset gate 166 with "one-of-end-selector" (not shown) where the non-selected outputs are all high and only one output goes low at any given time.

It is also noteworthy that the clock signal that is provided for toggling the PWM outputs "on" and counting the counter up or down is actually variable. This variable signal is under command of the CPU device 100 by way of the latch 176 which is connected to the address decode and strobe circuit 170 and to the variable rate divider 172. The variable rate divider 172 processes the pre-scaled phase 12 clock (from pre-scaler 174)signal on a line 173 according to the 8-bit value division divider 172 provided by the latch 176 thereby providing an output frequency which is variable over a range of 256 to 1 on an input frequency which is already pre-scaled down to a usable level. The term "usable" means significantly below the typically one megahertz-operated two-phase line.

Input Board

Figure 8:
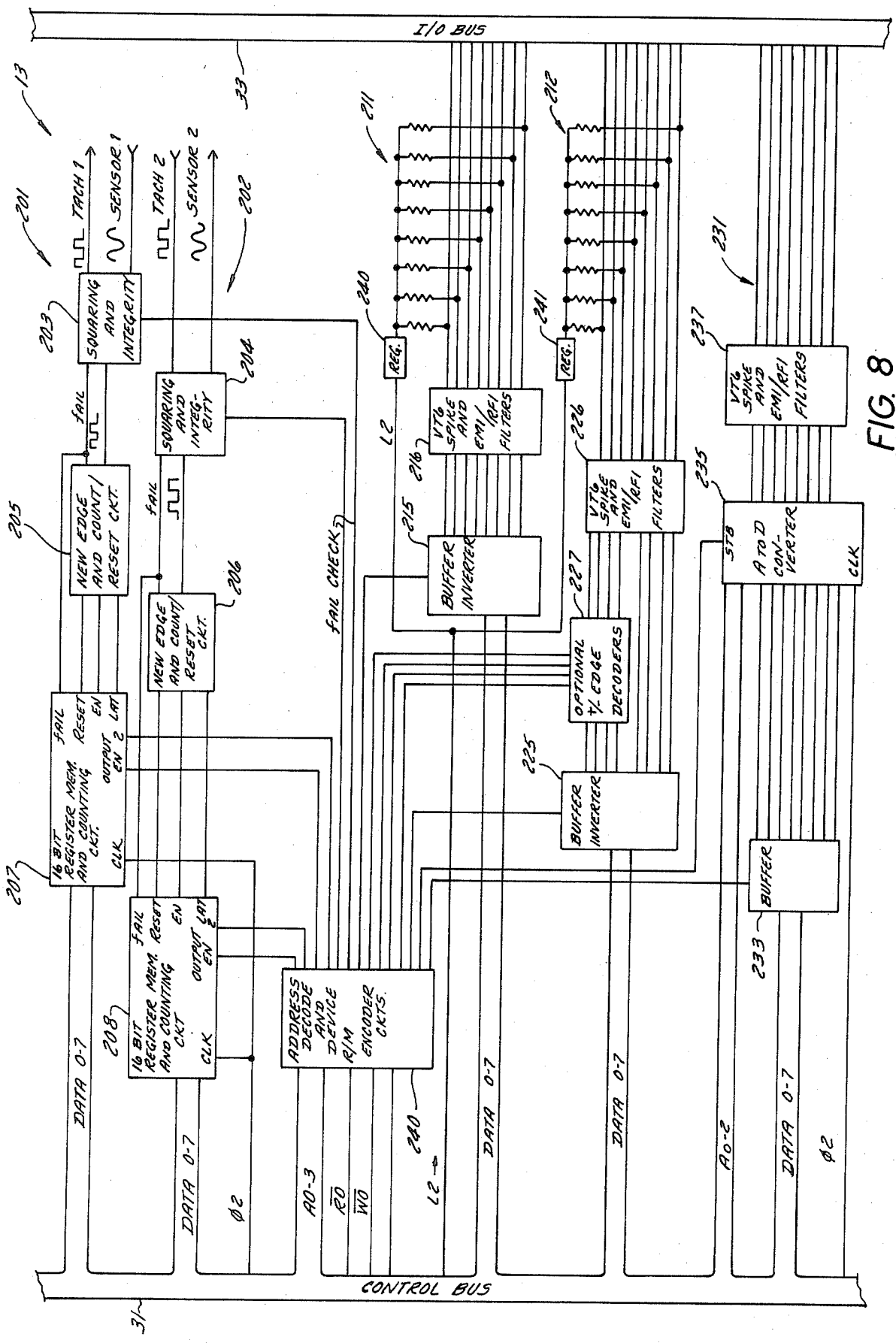
FIG. 8 is a simplified, partly schematic, circuit diagram of the input signal board shown in FIG. 4.

The input board 13 shown in FIGS. 4 and 8 is constructed and operates as follows. Input board 13 generally comprises the following circuits (described in detail hereinafter) for sensing and processing various types of input signals received from several sensing devices on the vehicle (see FIG. 1) by way of I/O bus 33:

(1) two frequency input sensing circuits or channels 201 and 202 for receivng repetitive high-speed dynamic (variable) signals such as from vehicle speed sensors such as sensor A in FIG. 1;

(2) two squaring and integrity circuits 203 and 204 in circuits 201 and 202, respectively, for system verification by detecting failures in the latter circuits;

(3) two edge and count/reset circuits circuits 205 and 206 in circuits 201 and 202, respectively, for processing pulse-type speed signals to detect the edge-to-edge elapsed time of a squared pulse signal;

(4) two register memory and counting circuits 207 and 208 in circuits 201 and 202, respectively, for detecting edge to edge time (frequency) of the speed signals;

(5) two input switch sensing circuits or channels 211 and 212; circuit 211 including a buffer/inverter circuit 215 and a filter 216; circuit 212 including a buffer/inverter circuit 225, a filter 226 and an optional edge detector circuit 227;

(6) a variable value input sensing circuit 231 including a buffer 233, an analog-to-digital (A-D) converter 235, and a filter circuit 237; and (7) an address and decode circuit 240.

The sensing circuits 201 and 202 each receive signals from a speed or frequency type sensor such as A (FIG. 1) which uses, for example, a magnetic wire coil type pickup. Each circuit 203 and 204 squares up an incoming sinusoidally-shaped signal and provides a squared, output buffered and decoupled tach output signal. The circuits 203 and 204 each also provide an integrity checking function to determine whether the wires of the sensors A are shorted out, shorted to ground or shorted to a plus level. The squaring and integrity circuits 203 and 204 each provides two outputs, namely, a fail signal and a squared signal. The latter squared signal is not the same one as is provided as a tach output signal, going back to the connector board 11 but is an internal signal in the form of a low-level squared, non-buffered signal which is provided to the edge and count reset circuitry 205 or 206. Every time a positive going edge is detected by circuit 205 or 205, a cycle is started which provides as follows. First, counting to the succeeding counting circuits 207 and 208 is halted. Second, a latch of the count current from circuits 205 and 206 is sent into a set of holding latches. Third, a reset of the counting circuits 207 or 208 occurs. Fourth, a re-enabling of the counting circuits 207 and 208 occurs, so that upon every new edge being detected the counting circuits transfer the count from the last positive-going edge to the point-in-time current into the latch circuits. Fifth, the latch circuits get reset to zero and restart counting again. This provides a system wherein the counting circuits have the fastest possible counting mode derivable on a full cycle basis. That is to say, the counting circuits do not count alternate cycles and do not use the time between one set of cycles to do their updating. The updating is done on the fly at the beginning of every cycle. It takes eight microseconds to this time and the CPU device 100 has been provided with firmware necessary to add the eight microseconds of processing time back into the count which comes out of the circuits. This provides a means of immediately detecting frequency changes or frequency deviations coming from the sensors A. It literally gives an edge-to-edge tracking capability on the sensor frequency.

The counting circuits 207 and 208 are 16-bit devices. The register memory there is actually 15-bits, dropping the lowest significant bit of the counting circuit and replacing the most significant bit with a fail bit. The fail bit, which is a tag line connected back to the output of the squaring and integrity circuit 203 or 204, passes the information through to the CPU device 100 regarding the integrity of the sensor A itself. Any time a failure is detected the count reset circuits 205 and 206 are automatically forced into continuous cycling so that the CPU device 100 is immediately notified or updated with information indicative of a failed sensor. The two channels 201 and 202 are virtually identical and use only different addresses to enable their various outputs onto the control bus 31. These outputs are selected by way of the address decode and device read/write enable circuit 240.

The input switch sensing circuits 211 and 212 comprise two sets of buffer inverter drives 215 and 225, respectively, which are front-ended with voltage spike and EMI/RFI filters 216 and 226, respectively. In front of the filters are pullup resistors R1 and R2 which are driven from regulators 240 and 241, respectively. The switch sensing circuits 211 and 212 are each based on a switch-to-ground connection being made at the switch of choice on the vehicle (such as switch ERS in FIG. 1) The regulated output passed into pullup resistors R1 and R2 ensures that the spike and EMI/RFI filter circuits 216 and 226 are held within design range. Each buffer and inverter circuit 215 and 225 are enabled onto the bus 31 whenever the address for the desired switch bank is selected. The switch processing circuit 212 includes four stages for optional edge detectors 227 which can be strapped for detecting either positive or negative-going edges from the switch input.

The A to D converter 235 is an eight channel converter and is provided with an input conditioning circuit 237 for voltage spike and EMI/RFI filtering. The output of the A to D converter 237 is passed through a buffer 233 to the control bus 31. Though the A-D converter 235 can be assumed to have its own tristating control and could be selected directly, it is desirable not to try to power or work the entire control bus 31 from the lower power buffer 233 on the A-D converter 235. There are many configurations of apparatus wherein certain components shown in FIG. 8 are not needed. For example, the entire circuit 231 may not be needed or there may be no need for one of the switch input circuits 211 or 212 or only one speed input channel 201 and 202 may be needed according to design requirements.

A typical use for A-D converter 235 is to transduce the location of a clutch pedal or throttle switch TPS in FIG. 1, for example, wherein the pedal is connected to a rotary or linear potentiometer device. It is possible to determine pedal position or rate of change of pedal position. Since some vehicle components are dynamic in that component positions vary considerably from day-to-day, startup of the vehicle is often accompanied by a brief procedure that the operator must follow. For example, he must let the pedal all the way up to zero position and then perform some operation which advises the CPU circuit 100 that the pedal is at the top. The CPU device 100 can then "learn" the analog level of the top of the pedal. The operator then procedurely pushes the pedal as far down as he can and that down position, with dirt, mud, sand, snow or whatever underneath it, is transduced so that the CPU device 100 can learn the lowermost position of the pedal. It is assumed that the pedal is provided with a travel range which exceeds the physical limits of the pedal itself as far as the transducers are concerned. The trans-transducer can read a signal beyond that distance which the pedal can move. The allowable or readable range of the pedal is then converted into a desired total signal range and the allowable pedal motion is factored out so that the CPU device 100 spreads out the specific range of the pedal and provides functional control to the operator so that the pedal gives complete control from zero percent to 100 percent. Since this is a soft-managed system, it is also possible to vary those characteristics. Thus, in an automobile clutch, for example, it is convenient to have about 20 or 30 percent pedal travel without any function and then a gradual increase of function for the next for half (40 percent) of the remaining travel and then a sharp increase in functioning for the remainder (40 percent). Such warping or contouring of characteristics is easily achievable by soft management since it is easy to transduce the location of the pedal and to factor the current location of the pedal into the allowable range of the pedal.

OPERATION OF THE ELECTRONIC CONTROLLER IN A SPECIFIC INSTALLATION

The following description explains how the afore-described electronic controller is installed and operates in a specific system such as shown in FIG. 1 which, for example, may be assumed to be a farm tractor but it is to be understood that it could function in a similar manner in some other analogous environment.

To simplify the discussion, the following description is divided into Sections 1 through 9 and each section contains numbered statements or passages. These sections are further identified as follows:
Section 1—General
Section 2—Operator Sequence of Control
Section 3—General Specifications
Section 4—General Electrical Requirements
Section 5—Control System Layout
Section 6—Control Logic
Section 7—Failure Modes
Section 8—Speed Criteria
Section 9—Control System Neutrals Section 1—General 1.1 The transmission control EC allows the operator to make full power shifts through twelve forward ranges and three reverse ranges. The control responds to operator initiated commands and energizes the correct combination of solenoids SV1–SV8 to achieve the transmission range selected. Operator commands sent to the control may be triggered by numerous commercially available switching devices, one possible arrangement being described herein.

1.2 The basic operator controls are: (See FIG. 1).

1.2.1 A three-position direction control lever DCL switch for selecting FORWARD, NEUTRAL or REVERSE.

1.2.2 A three-position range shift lever RSL to sequentially shift up or down one range per lever actuation.

1.2.3 A foot pedal FP to allow hydraulic modulation of the master clutch in first forward and reverse forward only, and to give neutral, electrically, when depressed in all other ranges (up or down shift on output speed).

1.3 Basic features of the control system are:
1.3.1 A digital display 65 of transmission gear.
1.3.2 A "Power On" indicator for input power (not shown).
1.3.3 A "Failed Speed Sensor" (not shown).
1.3.4 A "Failed Foot Pedal Switch" (not shown).
1.3.5 A speed sensing circuit A allowing the controller EC to make decisions based on output speed.
1.3.6 A lockup interrupt driver (latch plate timer) is provided to disengage lockup LU during shifts, or to be used to trigger the latch plate solenoid during shifts.
1.3.7 Integrity checking of solenoid driver circuits.

Section 2—Operator Sequence of Control

From the standing start, the operator may select either first FWD or first REV by moving the direction control lever DCL. The selected gear will be immediately achieved, i.e., 1st FWD or 1st REV.

The operator may make a smooth start in either of these directions by pushing the foot pedal F before engaging the transmission. The foot pedal will then allow a controlled engagement of the wet master clutch, similar to the clutch pedal in an automobile. Note: the foot pedal controls clutch pressure up to approximately ⅓ capacity, and thereafter by a rate of rise to full capacity, the rate being independent of operator control. The rate of rise is interruptable by pedal command below ⅓ capacity, such occurrence causing the pressure to drop immediately to a pressure appropriate to pedal position. If the operator's pedal commands no more than ⅓ capacity, his pedal will dictate pressure solely as a function of pedal position. The intention of this function is to prohibit clutch modulation for extended periods at capacities above ⅓.

The first 90% of travel of the pedal potentiometer will correspond to a current variation from 0 to 0.27 amps (approximately). The last 10% travel of the potentiometer will not be a controllable region but will initiate the rate or rise mentioned above.

If the operator chooses not to push the pedal, moving the lever DCL from neutral to either FWD or REV will engage a gear in the selected direction as follows: (a) if REV is chosen the proper non-modulated clutches for 1st REV will be immediately engaged followed by a timed engagement of the appropriate modulated clutch. The time schedule is to be 0.1 second at 100% modulation, followed by a drop to 16% modulation and a ramp to 100% modulation over an interval of 0.82 seconds, or (b) if FWD is chosen with vehicle having a speed above that correct for 1st FWD, then the correct combination of three solenoids will be engaged immediately without scheduling; otherwise, when FWD is selected, 1st FWD will be engaged in the time sequence used for 1st REV above. From 1st FWD gear, the operator may make an upwhift to 2nd by pushing the shift lever from center to the "UPSHIFT" position Repeated cycles of the shift lever allow sequential shifts up to 12th gear. Note: 2nd through 12th gears are not modulatable.

Moving the shift lever to the "DOWNSHIFT" position will cause successive downshifts, down to 1st but no lower, i.e., NEUTRAL is not achievable by the downshift lever.

To achieve NEUTRAL, either the direction lever must be moved to NEUTRAL, or the foot pedal depressed. NEUTRA1 may be obtained at any time regardless of vehicle motion.

Pushing the foot pedal in 1st FWD and 1st REV causes NEUTRAL hydraulically. Initial movement of the pedal in 2nd FWD through 12th FWD and 2nd REV through 3rd REV gives neutral by signalling controller EC to disengage all transmission clutches. Actuation of the switch FPS at the bottom of the pedal FP causes two functions: in 1st FWD and 1st REV, it actuates an anti-creep function; in all ranges, it removes power to all solenoids except those used for the anti-creep.

Moving the direction control lever to NEUTRAL gives a computer neutral and also a neutral disconnect which physically removes power from all transmission solenoids except SV1 and SV5 (and solenoid designated "latch plate solenoid.)

Anti-creep is also activated if the lever is in NEUTRAL and the speed is below 2nd gear Releasing the pedal or returning the direction lever from NEUTRA1 to FWD or REV causes some gear to be engaged in the transmission. Note: moving the direction control lever to either FWD or REV engages the transmission in that selected direction regardless of speed or direction of travel. When REVERSE is selected, the control energizes 1st REV regardless of speed or vehicle direction of motion. When FORWARD is selected, the control energizes a forward range dependent on the speed signal (but not dependent on actual direction of vehicle motion). The foot pedal is always fully functional and may be used to give NEUTRAL at any time.

Section 3—General Specifications 3.1 The electronic controller EC is a multi-board device mounted in an enclosure (see FIGS. 2 and 3). Inputs and outputs of the device are by way of several mutli-pin and circular connectors 52. The required components are mounted on circuit boards, covered in a conformal coating, and integrated into a unit capable of withstanding environmental operating conditions of great severity.

3.2 Electrical noise and faults must be accomodated as follows:

3.2.1 Function of all circuits is to be unaffected by citizens band or other radio transmissions.

3.2.2 Circuitry should be protected against reverse polarity of input power and outputs to solenoids must be protected against catastrophic failure due to a continuous short to ground. A protection means should be provided to minimize the effects of a fault condition wherein a solenoid is unintentially energized (Example: continous integrity checks on all outputs.)

3.2.3 Momentary loss of input power for 100 milli-seconds or less will not cause any transmission shift, or loss of control logic.

3.2.4 Input power drift and fluctations over the range of 8-30 VDC should be tolerated without malfunction or loss of control logic. (Reduced power may cause lack of solenoid response and consequently loss of hydraulic function).

3.2.5 Voltage drops below 9 VDC, preferably lower, for more than 100 milli-seconds will reinitiate the power-up sequence (Sec. 6.1).

3.3 Mechanical constraints are as follows:

3.3.1 The control unit EC should be housed in an enclosure per a particular installation.

Section 4—General Electrical Requirements 4.1 Input power may be any direct current voltage between 10 volts and 30 volts, and typically operate off a vehicle battery BT. Special requirements for the power supply must be indicated if found necessary in order to achieve the desired control. It is acceptable to require a minimum of 10 VDC to power-up but afterwards acknowledge a power failure if voltage drops below lower limit of 3.2.5.

4.2 The transmission is controlled by 15 watt solenoids which may be either 12 VCD or 24 VCD (nominal). Suitable precautions should be taken to accomodate the inductive nature of these electrical loads. Solenoids will be commoned at the transmission and one separate conductor provided to return this common to the enclosures.

4.3 The controller EC has speed sensing circuitry which is monitoring transmission output speed as sensed by a reluctance type magnetic pickup A (simmilar to Electro Products P/N 3030-HTB, or an Eagle Controls P/N 8070-00845B) which is responding to 60 teeth rotating at transmission output speed. It may be assumed that the sensor has a DC resistance of 300 to 3000 ohms.

Section 5—Control System Layout 5.1 FIG. 1 illustrates the physical layout of the control system. The primary function of the control system is to allow the operator to initiate a transmission gear change and visually detect its status by a display device 65.

5.2 The operator control devices are as follows:

5.2.1 A direction control lever (DCL) having three discrete positions labeled "FWD", "NEUT" and "REV". Each position of the DCL closes a set of contacts which defines lever position to the control. Each of these contacts is a single pole, isolated, normally open contact. One contact is held closed in each lever position. If both contacts are closed, the first shall predominate. If simultaneously closed, NEUTRAL is implied. A shift from FWD to REV (or REV to FWD) is not eligible unless both contacts are detected as open in the NEUTRAL lever position. This fault should cause a unique error code and may create a computer neutral condition. In addition, the NEUTRAL position also has an added normally closed contact (held open in NEUTRAL) for removing power from all solenoids, except SV1 and SV5 and the latch plate solenoid, when the DCL is in NEUTRAL.

5.2.2 Range shift lever (RSL) having a spring return to center mechanism with actuated positions labeled "RABBIT" and "TURTLE". The center position is not labeled but is referred to as "CENTER". Each actuated position of the RSL closes a set of contacts which defines lever position to the control. Each of the two contacts is a single pole, isolated, normally open contact. One contact is held closed in each lever position, but the center position is implied by the absence of either an upshift or downshift contact closure. Some applications will have the DCL and RSL combined into a single lever.

5.2.3 A foot pedal FP connected to electric control EC and having a switch arranged to indicate pedal position. The foot pedal switch (FPS) is positioned such that FPS will indicate final pedal travel (bottom). The switch will be closed and will be opened upon detection of pedal position.

5.3 The transmission range is controlled by a bank of eight solenoids SV1-SV8 selectively energized three at a time.

5.4 An LED should be conspicuously mounted to indicate the following situation. A red LED is "ON" whenever power is applied to the control EC.

5.5 A driver should be available to energize a solenoid beginning when any shift is initiated, regardless of the manner in which the shift was selected. This solenoid may be used as a lockup interrupt, latch plate time, or other signal. Power to this solenoid should not be removed when the direction control lever is in its NEUTRAL position.

5.6 A driver for solenoid control of Master Clutch lube flow. This solenoid is on during modulation of Master Clutch in either 1st FWD or 1st REV. Function triggered upon initial clutch pedal movement and remains on until pedal is fully released.

Section 6—Control Logic

This section describes the control logic and sequences required to control transmission in response to operator commands, the transmission output and various other parameters.

POWER-UP 6.1.1 Control circuitry is active if the applied voltage is between 9 VDC and 30 VDC. A wider range is desirable. See 4.1.

6.1.2 A power-up sequence is executed when power is applied to the control; it also is executed when an intermittent power failure of more than 100 milliseconds (typical at 12 VDC supply) occurs.

6.1.3 No control outputs are enabled until the DCL is in NEUTRAL. This condition requires that, upon regaining power from some fault, the DCL must be returned to "NEUT" even though the vehicle may be moving. Foot pedal position is immaterial to power-up. " " error code is displayed until the DCL is placed in NEUTRAL. The " " code is not clearable on power-up if either the upshift or downshift contact is closed.

6.1.4 The "P" code will signify an interruption of power due to a loose connection or low battery voltage experienced while the DCL was out of NEUTRAL.

6.1.5 Normal power-up occurs with the DCL in "NEUT" because of a Neutral Start Relay (NSR) circuit which is entirely external to the control enclosure. The NSR is energized by contracts which are closed only when the DCL is in "NEUT". If the engine is started by some means (jump start, hot wire, etc.) where the DCL is not in "NEUT", the control will not be enabled until the DCL is returned to "NEUT". A transmission oil pressure switch may be included as a signal to the control not to engage solenoids unless engine oil pressure is available.

6.1.6 If power is applied while the vehicle is moving, the speed sensing circuitry must compute the gear to be engaged when a return to gear is made as described in Section 6.5. The intention of the speed sensing circuity is to cause a safe return to a gear without operator intervention.

6.1.7 The "Power-On" LED should indicate that system power is available and above 10 VDC.

6.2.1 When the DCL is in NEUTRAL, or moved through the NEUTRAL position, the NEUTRAL gear will always be achieved in the transmission. Achieving the NEUTRAL gear requires a sequence defined in Section 2.

6.2.2 When DCL is moved to "REV" (from "NEUT" or any forward range), 1st REV gear in the transmission will be signalled electrically (but may be altered by the foot pedal at the operator's discretion). The reversal is totally uninhibited except that the time delay between shifts requires that the NEUTRAL gear will be achieved before the shift to REVERSE gear. This function is independent of RSL (normally centered).

6.2.3 When moved to "FWD" from "NEUT" or "REV" (at any vehicle speed), some forward range will be signalled in the transmission. NOTE: The foot pedal may affect the transmission by either allowing modulation or causing NEUTRAL (N1).

6.2.4 When the DCL is in "NEUT" for more than 0.5 sec:
(a) The NSR is enabled by a contact closure (not a controller function).
(b) The power is removed from all solenoids except SV1, SV5 and the latch plate solenoid.
(c) The control will achieve the NEUTRAL gear if the speed is below 2nd gear speed.

6.2.5 Transitions of the DCL to NEUT are to be treated as a shift from the range engaged directly to NEUTRAL. Transitions of the DCL through NEUTRAL are to be treated as two shifts, one from the range previously engaged to NEUTRAL gear, followed by a shift from NEUTRAL gear directly to the gear to be engaged. Time delay between shifts applies in all cases. See Section 2 for NEUTRAL gear definition.

6.3 Range Shift Lever (RSL)

6.3.1 When in FWD on the DCL, the RSL increments or decrements one range at a time, but will not allow down shifting to NEUTRAL. Upshifts will be limited by software such that repeated attempts to upshift past the limit will have no effect. The RSL will not cause a shift from NEUTRAL to 1st. When in REV on the DCL the RSL causes sequential shifts in REV. The increment from 1st REV to 2nd REV requires one upshift command. Software means should be provided to limit upshifts in REV. Downshift commands cause sequential REV shifts down to 1st REV but not to NEUTRAL. The RSL will not cause a shift from NEUTRAL to REVERSE.

6.3.2 The RSL is acknowledged any time the DCL is in "FWD" or "REV" but only if the DCL has been in "FWD" or "REV" for at least 50 milli-seconds prior to an RSL contact closure. The RSL cannot alter the gear to be engaged (displayed) when the DCL is in NEUTRAL because the direction to be selected is not known; nor can the return gear be displayed.

6.3.3 If the RSL is held in the "UPSHIFT" position, continuous upshifts (in FWD only) will be executed on a timed basis. If held in the "DOWNSHIFT" position, continuous downshifts will be executed on a timed basis, down to 1st FWD if the DCL is in FWD, or down to 1st REV if the DCL is in REV. The time delay between any gear change is 800 milli-seconds.

NOTE: Non-sequential shifts (e.g. 4-5-4) are to be executed at 1.0 second intervals.

6.3.4 The upshift or downshift commands will be acknowledged only if the foot pedal is not pushed.

6.3.5 A rapid succession of shift commands, due to cycling the RSL, should be ignored until a delay of 800 milli-seconds (or 1.0 second dependent on gear seleted) from the previous shift has occurred. The first command after the delay should cause a shift. Cycling the RSL should not cause cummulative delays.

6.3.6 If the foot pedal is pushed while maintaining the RSL in an actuated position, display immediately the SPG, (speed program gear), and engage the SPG when return from foot pedal NEUTRAL.

6.4 Foot Pedal In 1st FWD and 1st REV, the pedal modulates the clutch pressure which has been electrically enabled (See FIG. 1). The foot pedal also has a normally closed switch contact which opens at the bottom of the pedal travel (FPS).

6.4.1 In the modulateable ranges, 1st REV and 1st FWD, the appropriate solenoid combinations are engergized during foot pedal modulation.

6.4.2 In 2nd FWD through 12th FWD and 2nd REV through 3rd REV, a depressed pedal causes a computer neutral (N1) by de-energizing all solenoids. The bottom foot pedal switch causes a redundant neutral if pedal is fully depressed.

6.4.3 When the foot pedal is released, the transmission will always return to same gear under normal circumstances.

6.4.3.1 While the pedal is pushed, provided the DCL is in FWD or REV, the display will show the gear to be engaged upon release of the pedal. If return is made to 1st FWD or 1st REV, the pedal allows controlled master clutch engagement.

6.4.3.2 Releasing the pedal causes a return to a gear appropriate to the SPG (see 6.5.1). Note that as the vehicle comes to rest, the pedal allows a return to 1st FWD (if the DCL is in FWD) or 1st REV (if the lever is in REV), both of which are modulatable. Without specific operator action, a gear appropriate to vehicle speed is assured.

6.4.3.3 The return gear (whether or not speed dependent) is lighted in the display while the pedal is pushed, and indicates the gear that will be engaged if the pedal is released. There are no delays during SPG gear updating.

6.4.3.4 Foot Pedal Switch Check: If foot pedal is fully depressed, foot pedal switch should show open.

6.4.5 In 1st FWD or 1st REV, the FPS signals an anti-creep function which turns on solenoids SV1 and SV5.

6.5 Speed Criteria 6.5.1 Transmission output speed is used to select a range to be engaged when returning to gear from a neutral, but not necessarily stationary, condition. Various applications may require redefining the SPG values and the control should lend itself to such changes.

6.5.2 From a foot pedal NEUTRAL, the return gear is speed dependent in both FWD and REV, and may include any gear normally achievable. In REV, however, only decreasing speed program gears are allowed based on speed (See 6.4.3). From a DCL neutral, any range may be chosen by the control as the appropriate gear to be engaged from NEUTRAL. Since either direction could be chosen from NEUTRAL on the DCL, a return gear, if FWD is selected, should be computed and energized if the DCL is moved to FWD. If the DCL is moved to REV, the selected range will always be first REV. With the DCL in NEUTRAL, no display indication of the return gear is possible nor is the operator able to override the return gear.

6.5.3 Upon returning from NEUTRAL to the SPG on either the foot pedal or the DCL, the SPG calculated at that time is to be engaged without delay.

6.6 Display 6.6.1 If the DCL is in "NEUT", the NEUTRAL symbol will be on continuously (See 5.4.3.4).

6.6.2 If the DCL is in "FWD" or "REV", the display shows the range engaged, or if the foot pedal is pushed, shows the range that will be engaged when the pedal is released.

6.6.3 The control responds to the RSL if the DCL is in "FWD" or "REV" and the display follows accordingly. If foot pedal is depressed, at zero speed, no upshifting is allowed with the RSL.

6.6.4 The display will use the following segments to indicate range:

| p̄11 | |
|---|---|
| Neutral 0 | 9th FWD 9 |
| 1st FWD 1 | 10th FWD 10 |
| 2nd FWD 2 | 11th FWD 11 |
| 3rd FWD 3 | 12th FWD 12 |
| 4th FWD 4 | 1st REV A1 or R1 |
| 5th FWD 5 | 2nd REV A2 or R2 |
| 6th FWD 6 | 3rd REV A3 or R3 |
| 7th FWD 7 | |
| 8th FWD 8 | |

6.7 Anti-Creep

The purpose of the anti-creep function is to prevent clutch drag in neutral from causing the tractor to move. Anti-creep is signalled by FPS only in FWD1 and REV1. Whenever a signal is received by the controller that the transmission is in FWD, or REV, and FPS is open, it will turn on solenoids SV1 and SV5. Note that this is not a vehicle brake. In NEUTRAL, the DCL signals the anti-creep function.

Section 7—Failure Modes 7.1 Failure Mode: Loss of speed and send magnetic pickup.

7.1.1 Immediately, upon detection of a failed pickup, display an error code alternately with the gear engaged.

7.1.2 Control should allow continued transmission operation and obey all shift commands until a foot pedal actuation or a direction control lever change initiates a new mode of operation in response to the pickup failure.

7.1.2.1 Moving the direction lever to NEUTRAL, engages the NEUTRAL gear and displays alternately with theerror code. The next selected position of the direction lever gives either 1st FWD, or 1st REV (as appropriate to the lever position) regardless of vehicle speed or direction of travel. Modulation capability via the foot pedal is allowed. Once engaged, shifting is allowed.

7.1.2.2 Pushing the foot pedal causes "0" to be displayed alternately with the error code. Release of the pedal engages no clutches and the transmission remains disengaged regardless of vehicle speed or direction, shift commands, or further foot pedal actuations. The next gear that may be engaged is either 1st FWD or 1st REV and is achieved by cycling the direction lever as in 7.1.2.1 above.

7.1.3 The digital display is to show the error code.

7.1.4 The definitiion of "failed pickup" should include not only shorts or opens but also lack of pulses being generated, when appropriate (i.e., any time the transmission is engaged in 2nd or above, a signal in excess of 50 HZ should be detected).

7.1.5 For the duration of the error condition, pushing the foot pedal fails the transmission to full disengagement. The error code is cleared by restoring the pickup signal and completing the power-up sequence.

7.2 Loss of Power 7.2.1 Transmission will shift to Neutral.

7.2.2 Power LED will be "off" (may be one segment of Error Code Bar).

7.2.3 Momentary loss of power, 100 MS or less, should not cause a shift nor require any resetting.

7.2.4 "P" code may appear.

7.3.1 Redundant NEUTRAL will not be available.

7.3.2 Upon power-up, error code will be displayed alternately.

7.3.3 Anti-creep will not be available. 7.4 Failed Integrity Check of Output 7.4.1 Transmission failed to Neutral or fuse blown. Give error code "_".

7.4.2 May be due to shorted or opened solenoid or bad cable to solenoids.

7.4.3 Repair fault to clear code.

Section 8—Speed Criteria

| | TRANSMISSION UPSHIFT AND DOWNSHIFT SPEED CRITERIA 2100 RPM ENGINE | | |
|---|---|---|---|
| UP-SHIFTS | TRANSMISSION OUTPUT SPEED IN HERTZ 5% | DOWN-SHIFTS | TRANSMISSION OUTPUT SPEED IN HERTZ 5% |
| 1-2 | 323 | 2-1 | 309 |
| 2-3 | 395 | 3-2 | 378 |
| 3-4 | 483 | 4-3 | 462 |
| 4-5 | 590 | 5-4 | 564 |
| 5-6 | 723 | 6-5 | 692 |
| 6-7 | 881 | 7-6 | 843 |
| 7-8 | 955 | 8-7 | 913 |
| 8-9 | 1166 | 9-8 | 1115 |
| 9-10 | 1420 | 10-9 | 1359 |
| 10-11 | 1737 | 11-10 | 1662 |
| 11-12 | 2118 | 12-11 | 2026 |
| R1-R2 | * | R2-R1 | 354 |
| R2-R3 | * | R3-R2 | 433 |

(*No upshifts permitted in reverse except under operator control)

Section 9—Control System Neutrals

N1 = Computer softward neutral, i.e., the microprocessor in the control is disconnecting the clutch packs to cause NEUTRAL in all ranges except 1st FWD and 1st REV. This neutral condition is dependent upon the intelligence of the micro-processor.

N2 = Redundant NEUTRAL, i.e., electric power is physically removed from all clutches except the middle (Sol C1 and C5) two packs. This NEUTRAL is independent of the computer status and is caused by opening contracts on the DCL while it is in the NEUTRAL position, or actuation of the bottom foot pedal switch.

N3 = Hydraulic NEUTRAL, i.e., in 1st FWD and 1st REV, the appropriate clutches are all electrically " on" but not engaging the transmission because the foot pedal is hydraulically interrupting the engagements of the master clutch.

N4 = No power NEUTRAL, i.e., a state where no solenoids are energized; could be from a power failure or by having no solenoid drivers on.

NG = NEUTRAL Gear, i.e., a NEUTRAL condition where solenoids C1 and C5 are both engaged (in a time scheulde described below). Since none of the upper or lower packs are on, the transmission may coast and is therefore in a NEUTRAL condition. Any movement of the DCL to or through NEUTRAL causes a shift to or through the NEU- TRAL gear as follows: First: Immeidately signal all solenoids in transmission to go "off," i.e., go to N4, for 0.5 seconds. Second: Achieve the NEUTRAL gear by engaging both SV1 and SV5 (inner two packs) for 0.5 seconds. Third: Turn off all solenoids in transmission, i.e., go to N4 for 0.25 seconds. Fourth: Engage packs appropriate to DCL position, and other control inputs. NOTE: If DCL remains in NEUTRAL, the NEUTRAL gear solenoids will remain "on". NOTE: This sequence will also occur when bottom foot pedal switch is closed, then opened during anti-creep. See Section 6.7.

We claim:

1. In combination:
a first component operable at various speeds;
signal generating means responsive to the speed of said first component for providing an input signal comprising a series of pulsed signals which are variable in frequency and pulse width and whose frequency is related to said speed, each pulsed signal having a leading edge;
a transducer having means operable in response to an output signal to effect operation of a second component;
and an electric controller for receiving said input signal and for providing said output signal and comprising:
a counter for measuring the length of the time interval between the leading edges of an incoming pulsed signal and the preceding pulsed signal, means for resetting said counter in response to each incoming pulsed signal, and means responsive to detection of a time interval of predetermined length between said incoming pulsed signal and said preceding pulsed signal to determine frequency and to provide said output signal to effect operation of said transducer and said second component.

2. In combination in a power transmission system for a motor vehicle:
a drive shaft rotatable at various speeds;
signal generating means responsive to the speed of said drive shaft for providing an electrical input signal comprising a series of pulsed electrical signals which are variable in frequency and pulse width and whose frequency is related to said speed, each pulsed signal having a leading edge;
a solenoid operable in response to an electrical output signal to effect operation of a clutch connectable to said drive shaft;
and an electronic controller for receiving said input signal and for providing said output signal and comprising:
a counter for measuring the length of the time interval between the leading edges of an incoming pulsed signal and the preceding pulsed signal, means for resetting said counter in response to each incoming pulsed signal, and means responsive to detection of a time interval of predetermined length between said incoming signal and said preceding pulsed signal to determine frequency and to provide said electrical output signal to said solenoid to operate said clutch.

3. In combination:
apparatus comprising a first component operable at various speeds and a second component which is to be actuated when said first component reaches a predetermined speed;
and control means for said apparatus comprising:
signal generating means responsive to the speed of said first component for providing an input signal, said input signal comprising a series of pulsed signals which are variable in frequency and pulse width and whose frequency is related to speed, each pulsed signal having a leading edge;
a transducer having means operable in response to an output signal to actuate said second component;
and an electric controller for receiving said input signal and for providing said output signal and comprising:
a counter for measuring the length of the time interval between the leading edges of an incoming pulsed signal and the preceding pulsed signal, means for resetting said counter in response to each incoming pulsed signal, and means responsive to detection of a time interval of predetermined length between said incoming pulsed signal and said preceding pulsed signal to determine frequency and to provide said output signal to effect operation of said transducer and said second component.

4. In combination in a power transmission system for a motor vehicle:
transmission apparatus comprising a drive shaft rotatable at various speed and a solenoid-operated clutch which is to be actuated when said drive shaft reaches a predetermined speed;
and control means for said transmission apparatus comprising:
signal generating means responsive to the speed of said drive shaft for providing an electrical input signal, said input signal comprising a series of pulsed electrical signals which are variable in frequency and pulse width and whose frequency is related to speed, each pulsed signal having a leading edge;
a solenoid operable in response to an electrical output signal to actuate said solenoid-operated clutch;
and an electronic controller for receiving said input signal and for providing said electrical output signal and comprising:
a counter for measuring the length of the time interval between the leading edges of an incoming pulsed signal and the preceding pulsed signal, means for resetting said counter in response to each incoming pulsed signal, and means responsive to detection of a time interval of predetermined length between said incoming signal and said preceding pulsed signal to determine frequency and to provide said electrical output signal to said solenoid to operate said clutch.

5. In combination:
apparatus comprising a plurality of first components capable of changes in condition and a plurality of second components which are to be actuated when said first components undergo predetermined changes in condition,
said first components including a rotatable component operable at various speed,
said second components including a clutch component which is to be actuated when said rotatable component reaches a predetermined speed;
and control means for said apparatus comprising:

a plurality of signal generating means responsive to changes in condition of said first components to provide electrical input signals, said signal generating means comprising a first signal generating device providing digital signals indicative of a change in condition of an associated first component, a second signal generating device providing analog signals indicative of the magnitude of a change in condition of an associated first component, and a third signal generating device providing a series of pulsed signals which are variable in frequency and pulse width and in which the time interval between the leading edge of a pair of signals is indicative of the magnitude and rate of change in magnitude in the rotational speed of said rotatable components;

and an electronic controller for receiving said input signals from said signal generating devices and for providing output signals to operate said transducers to effect actation of said second components, said electronic controller comprising:

a counter for measuring the length of the time interval between the leading edges of an incoming pulsed signal and the preceding pulsed signal, from said third signal generating device, means for resetting said counter in response to each incoming pulsed signal, and means responsive to detection of a time interval of predetermined length between said incoming signal and said preceding pulsed signal to determine frequency and to provide said output signal to operate the transducer associated with said clutch component.

6. A combination according to claims 1 or 2 or 3 or 4 or 5 wherein said electronic controller determines the magnitude and rate of change of magnitude of said time interval.

7. A combination according to claim 6 wherein said electronic controller includes first memory means in which a program can be stored, second memory means in which said electrical input signals can be stored, and a central processing unit for processing said electrical input signals in accordance with said program and for providing said electrical output signals to said transducers.

* * * * *